(12) United States Patent  (10) Patent No.: US 8,748,938 B2
Masuoka et al.  (45) Date of Patent: Jun. 10, 2014

(54) SOLID-STATE IMAGING DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 0 days.

(21) Appl. No.: 13/769,586

(22) Filed: Feb. 18, 2013

(65) Prior Publication Data

US 2013/0214334 A1  Aug. 22, 2013

Related U.S. Application Data

(60) Provisional application No. 61/600,837, filed on Feb. 20, 2012.

(51) Int. Cl.
*H01L 29/74* (2006.01)
*H01L 31/111* (2006.01)

(52) U.S. Cl.
USPC ........... 257/146; 257/288; 257/292; 257/293; 257/E21.006; 257/E21.051; 257/E21.053; 257/E21.189; 257/E21.352; 257/E21.421; 257/E21.527; 257/E21.617

(58) Field of Classification Search
USPC ............. 257/146, 288, 292, 293, 59, 72, 212, 257/104, 148, 322, E21.006, E21.051, 257/E21.053, E21.189, E21.352, E21.421, 257/E21.527, E21.617
See application file for complete search history.

(56) References Cited

U.S. PATENT DOCUMENTS

| 5,017,977 A | 5/1991 | Richardson |
| 5,258,635 A | 11/1993 | Nitayama et al. |
| 5,308,782 A | 5/1994 | Mazure et al. |
| 5,312,767 A | 5/1994 | Shimizu et al. |
| 5,382,816 A | 1/1995 | Mitsui |

(Continued)

FOREIGN PATENT DOCUMENTS

| CN | 1507035 | 6/2004 |
| CN | 1610126 A | 4/2005 |

(Continued)

OTHER PUBLICATIONS

Office Action for U.S. Appl. No. 13/917,040 dated Aug. 6, 2013, 5 pages.

(Continued)

*Primary Examiner* — David Nhu
(74) *Attorney, Agent, or Firm* — Brinks Gilson & Lione

(57) ABSTRACT

There is provided a solid-state imaging device in which a plurality of pixels is two-dimensionally arranged in a pixel region. Each of the pixels is formed in an island-shaped semiconductor. In this island-shaped semiconductor, a signal line $N^+$ region and a P region are formed from the bottom. On an upper side surface of this P region, an N region and a $P^+$ region are formed from an inner side of the island-shaped semiconductor. Above the P region, a $P^+$ region is formed. By setting the $P^+$ region and the $P^+$ region to have a low-level voltage and setting the signal line $N^+$ region to have a high-level voltage that is higher than the low-level voltage, signal charges accumulated in the N region are discharged to the signal line $N^+$ region via the P region.

10 Claims, 23 Drawing Sheets

(56) References Cited

U.S. PATENT DOCUMENTS

| | | | |
|---|---|---|---|
| 5,416,350 A | 5/1995 | Watanabe | |
| 5,480,838 A | 1/1996 | Mitsui | |
| 5,627,390 A | 5/1997 | Maeda et al. | |
| 5,656,842 A | 8/1997 | Iwamatsu et al. | |
| 5,703,386 A | 12/1997 | Yasuda et al. | |
| 5,707,885 A | 1/1998 | Lim | |
| 5,710,447 A | 1/1998 | Tohyama | |
| 5,767,549 A | 6/1998 | Chen et al. | |
| 5,780,888 A | 7/1998 | Maeda et al. | |
| 5,811,336 A | 9/1998 | Kasai | |
| 5,872,037 A | 2/1999 | Iwamatsu et al. | |
| 5,905,283 A | 5/1999 | Kasai | |
| 5,994,735 A | 11/1999 | Maeda et al. | |
| 6,121,086 A | 9/2000 | Kuroda et al. | |
| 6,127,209 A | 10/2000 | Maeda et al. | |
| 6,175,138 B1 | 1/2001 | Noda | |
| 6,294,418 B1 | 9/2001 | Noble | |
| 6,373,099 B1 | 4/2002 | Kikuchi et al. | |
| 6,392,271 B1 | 5/2002 | Alavi et al. | |
| 6,406,962 B1 | 6/2002 | Agnello et al. | |
| 6,420,751 B1 | 7/2002 | Maeda et al. | |
| 6,461,900 B1 | 10/2002 | Sundaresan et al. | |
| 6,483,171 B1 | 11/2002 | Forbes et al. | |
| 6,624,459 B1 | 9/2003 | Dachtera et al. | |
| 6,658,259 B2 | 12/2003 | McIntosh | |
| 6,740,937 B1 | 5/2004 | Sushihara | |
| 6,747,314 B2 | 6/2004 | Sundaresan et al. | |
| 6,815,277 B2 | 11/2004 | Fried et al. | |
| 6,849,903 B2 | 2/2005 | Sushihara | |
| 6,861,684 B2 | 3/2005 | Skotnicki et al. | |
| 6,878,991 B1 | 4/2005 | Forbes | |
| 6,891,225 B2 | 5/2005 | Horiguchi et al. | |
| 6,943,407 B2 | 9/2005 | Ouyang et al. | |
| 7,052,941 B2 | 5/2006 | Lee | |
| 7,193,278 B2 | 3/2007 | Song | |
| 7,198,976 B2 | 4/2007 | Hirata | |
| 7,233,033 B2 | 6/2007 | Koyama et al. | |
| 7,241,655 B2 | 7/2007 | Tang et al. | |
| 7,271,052 B1 | 9/2007 | Forbes | |
| 7,368,334 B2 | 5/2008 | Yeo et al. | |
| 7,374,990 B2 | 5/2008 | Tang et al. | |
| 7,413,480 B2 | 8/2008 | Thomas | |
| 7,579,214 B2 | 8/2009 | Yamazaki et al. | |
| 7,619,675 B2 | 11/2009 | Horii | |
| 7,829,952 B2 | 11/2010 | Moniwa et al. | |
| 7,872,287 B2 | 1/2011 | Masuoka et al. | |
| 7,977,736 B2 | 7/2011 | Kim et al. | |
| 7,977,738 B2 | 7/2011 | Minami et al. | |
| 7,981,738 B2 | 7/2011 | Moniwa et al. | |
| 8,039,893 B2 | 10/2011 | Masuoka et al. | |
| 8,058,683 B2 | 11/2011 | Yoon et al. | |
| 8,067,800 B2 | 11/2011 | Hsieh | |
| 8,110,869 B2 | 2/2012 | Bhalla | |
| 8,154,076 B2 | 4/2012 | Takaishi | |
| 8,188,537 B2 | 5/2012 | Masuoka et al. | |
| 8,227,305 B2 | 7/2012 | Forbes | |
| 8,378,400 B2 | 2/2013 | Masuoka et al. | |
| 8,426,902 B2 * | 4/2013 | Masuoka et al. | 257/292 |
| 8,482,047 B2 | 7/2013 | Abbott et al. | |
| 8,575,662 B2 * | 11/2013 | Masuoka et al. | 257/229 |
| 2001/0052614 A1 | 12/2001 | Ishibashi | |
| 2002/0000624 A1 | 1/2002 | Takemura et al. | |
| 2002/0034853 A1 | 3/2002 | Alavi et al. | |
| 2002/0110039 A1 | 8/2002 | Forbes et al. | |
| 2002/0195652 A1 | 12/2002 | Maeda et al. | |
| 2003/0002093 A1 | 1/2003 | Hynecek | |
| 2003/0075758 A1 | 4/2003 | Sundaresan et al. | |
| 2004/0005755 A1 | 1/2004 | Moniwa et al. | |
| 2004/0113207 A1 | 6/2004 | Hsu et al. | |
| 2004/0135215 A1 | 7/2004 | Song | |
| 2004/0169293 A1 | 9/2004 | Sushihara | |
| 2004/0256639 A1 | 12/2004 | Ouyang et al. | |
| 2004/0262681 A1 | 12/2004 | Masuoka et al. | |
| 2005/0127404 A1 | 6/2005 | Sushihara | |
| 2005/0145911 A1 | 7/2005 | Forbes et al. | |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0085088 A1 | 4/2009 | Takaishi |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1 | 8/2010 | Masuoka et al. |
| 2010/0200913 A1 | 8/2010 | Masuoka et al. |
| 2010/0207172 A1 | 8/2010 | Masuoka et al. |
| 2010/0207201 A1 | 8/2010 | Masuoka et al. |
| 2010/0207213 A1 | 8/2010 | Tan et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 | 9/2011 | Masuoka et al. |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |
| JP | 06-021467 A | 1/1994 |
| JP | 06-069441 | 3/1994 |

(56) References Cited

FOREIGN PATENT DOCUMENTS

| | | |
|---|---|---|
| JP | 06-237003 A | 8/1994 |
| JP | 07-099311 | 4/1995 |
| JP | 07-321228 | 12/1995 |
| JP | 08-078533 A | 3/1996 |
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 1/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 | 5/2005 |
| JP | 2006-024799 A | 1/2006 |
| JP | 2006-514392 | 4/2006 |
| JP | 2006-294995 A | 10/2006 |
| JP | 2007-0250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

Notice of Allowance for U.S. Appl. No. 12/704,935, dated May 16, 2013, 10 pages.
Notice of Allowance for U.S. Appl. No. 13/046,113, dated May 13, 2013, 10 pages.
Notice of Allowance for U.S. Appl. No. 13/412,959, dated May 8, 2013, 9 pages.
Office Action for U.S. Appl. No. 13/116,506, dated Jul. 18, 2013, 12 pages.
Notice of Allowance for U.S. Appl. No. 12/894,923, dated Jul. 2, 2013, 9 pages.
Notice of Allowance for U.S. Appl. No. 13/606,823, dated Jul. 8, 2013, 12 pages.
English translation of previously cited International Search Report for PCT/JP2011/070534, dated Dec. 6, 2011, 2 pages.
English translation of previously cited International Search Report for PCT/JP2011/071162, dated Dec. 13, 2011, 5 pages.
Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.
Chen, Yijian et al., "Vertical integrated-gate CMOS for ultra-dense IC", *Microelectronic Engineering*, vol. 83, 2006, pp. 1745-1748.
Choi, Yang-Kyu et al., "FinFET Process Refinements for Improved Mobility and Gate Work Function Engineering," IEEE, 2002, 4 pages.
Office Action for Chinese Patent Application Serial No. 200980103454.9, dated Oct. 31, 2012, 7 pages.
Office Action for Chinese Patent Application Serial No. 200980103505.8, dated Nov. 1, 2012, 5 pages.
Office Action for Chinese Patent Application Serial No. 201010171435.4, dated Dec. 21, 2012, 7 pages.
Office Action for Chinese Patent Application Serial No. 2011100647037, dated Nov. 14, 2012, 6 pages.
Office Action for Japanese Patent Application Serial No. 2009-538870, dated Nov. 8, 2012, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 10009574.4, dated May 15, 2012, 6 pages.
Extended European Search Report for European Application No. 12001395.8, dated Apr. 26, 2012, 7 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers*, pp. 927-929, 1997.
Hieda, K. et al., "New Effects of Trench Isolated Transistor Using Side-Wall Gates", *VLSI Research Center*, Toshiba Corporation, 1987, 4 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2007/071052, dated Jan. 29, 2008, 6 pages.
International Search Report for International Application No. PCT/JP2008/051300, dated May 13, 2008, 4 pages.

(56) References Cited

OTHER PUBLICATIONS

International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051459, dated Apr. 14, 2009, 4 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
International Search Report for International Application No. PCT/JP2011/070534, dated Dec. 6, 2011, 10 pages.
International Search Report for International Application No. PCT/JP2011/071162, dated Dec. 13, 2011, 18 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nakamura, Jun-ichi et al., "Nondestructive Readout Mode Static Induction Transistor (SIT) Photo Sensors," IEEE Transactions on Electron Devices, 1993, vol. 40, pp. 334-341.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.
Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action from co-pending U.S. Appl. No. 12/704,935, dated Nov. 18, 2011, 9 pages.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Office Action from co-pending U.S. Appl. No. 12/704,955, dated Dec. 8, 2011, 12 pages.
Office Action from counterpart Korean Application No. 10-2010-7018204, dated Mar. 29, 2012, 7 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Watanabe, S. et al., "A Novel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2007/071052, dated Jan. 29, 2008, 9 pages.
Written Opinion of the International Searching Authority for International Application No. PCT/JP2008/051300, dated Aug. 30, 2010, 8 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2008/058412, dated Jun. 10, 2008, 4 pages.
Written Opinion of the International Searching Authority for International Application No. PCT/JP2009/051459, dated Aug. 30, 2010, 8 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Written Opinion of the International Searching Authority for International Application No. PCT/JP2009/058629, dated Jun. 2, 2009, 4 pages.
Wu et al., "High Performance 22/20nm FinFET CMOS Devices with Advanced High-K/Metal Gate Scheme", IEEE, pp. 27.1.1-27.1.4, 2010.
Wuu, S.G. et al., "A Leading-Edge 0.9 µm Pixel CMOS Image Sensor Technology with Backside Illumination: Future Challenges for Pixel Scaling", *IEDM2010 Digest Papers*, 14.1.1, pp. 332-335, 2010.
Yonemoto, Kazuya, "A CMOS Image Sensor with a Simple FPN-Reduction Technology and a Hole Accumulated Diode," 2000 IEEE International Solid-State Circuits Conference, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Office Action for Korean Patent Application Serial No. 9-5-2013-010869116, dated Feb. 18, 2013, 4 pages.
International Search Report for PCT/JP2011/079300, dated Mar. 13, 2012, 5 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-µm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.

(56) References Cited

OTHER PUBLICATIONS

Notice of Allowance for U.S. Appl. No. 13/043,081, dated Mar. 18, 2013, 6 pages.

Notice of Allowance for U.S. Appl. No. 13/113,482, dated Apr. 4, 2013, 10 pages.

Notice of Allowance for U.S. Appl. No. 12/768,290, dated Apr. 18, 2013, 9 pages.

* cited by examiner

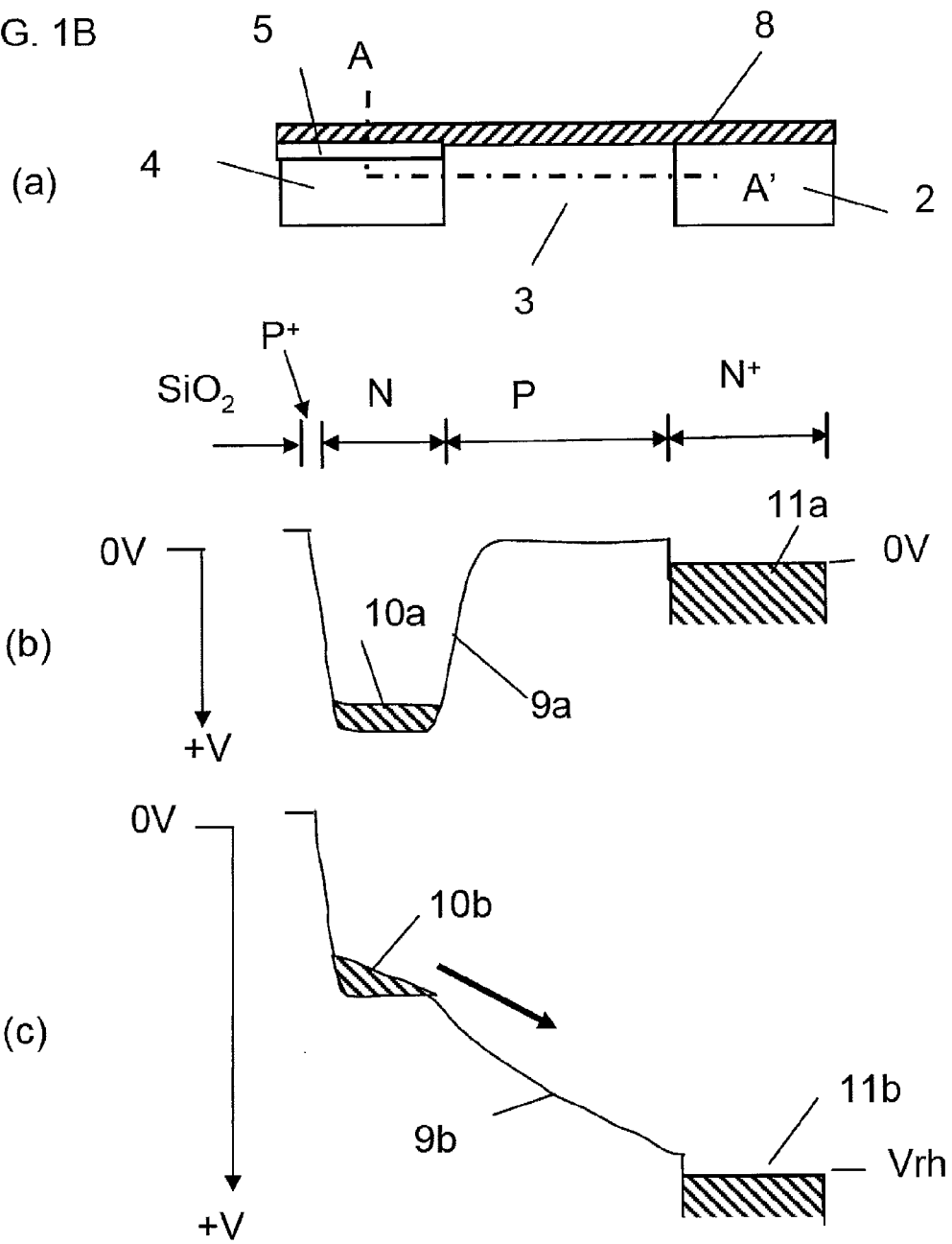

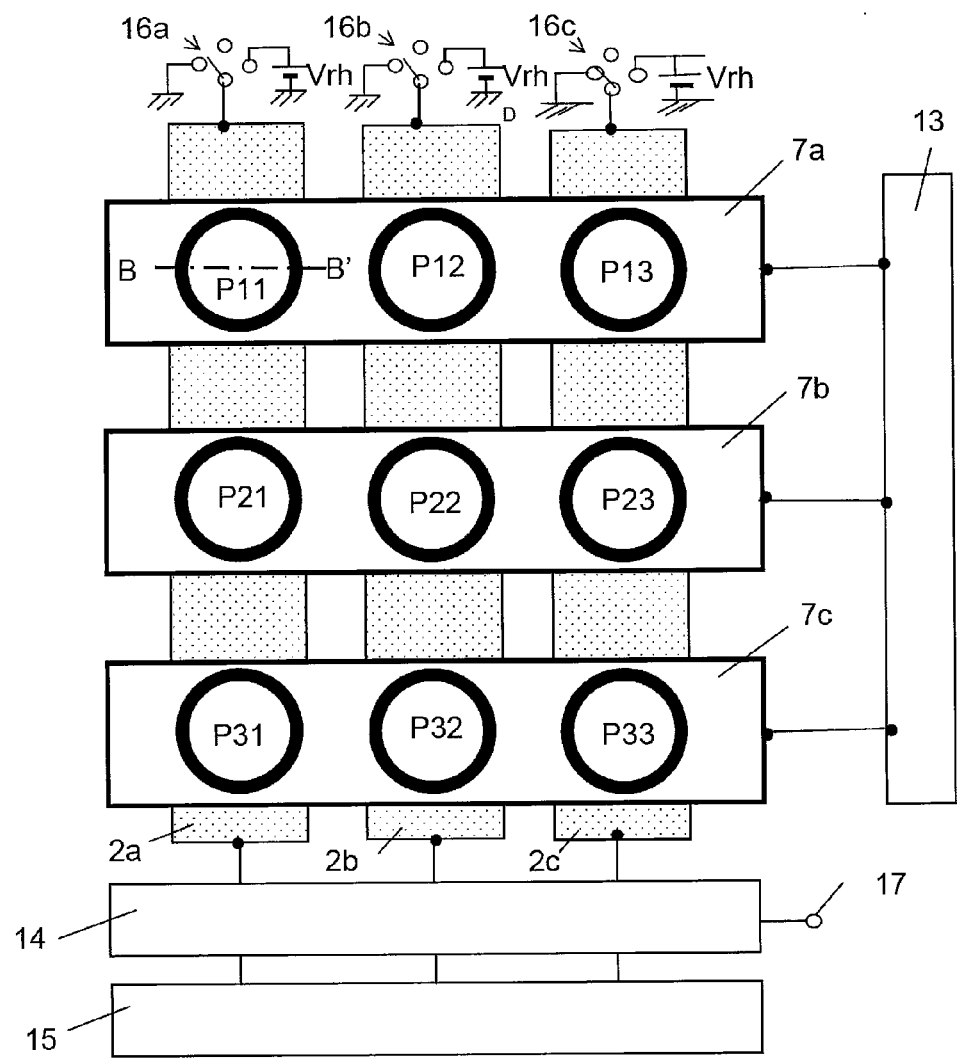

SOLID-STATE IMAGING DEVICE

RELATED APPLICATIONS

Pursuant to 35 U.S.C. §119(e), this application claims the benefit of the filing date of Provisional U.S. Patent Application Ser. No. 61/600,837 filed on Feb. 20, 2012. The entire content of this application is hereby incorporated by reference.

BACKGROUND OF THE INVENTION

1. Field of the Invention

The present invention relates to solid-state imaging devices and, more particularly, to a solid-state imaging device in which the pixel density is increased, the power consumption is reduced, and the light leakage is reduced.

2. Description of the Related Art

Currently, solid-state imaging devices are widely used in video cameras, still cameras, and so forth. Improvements in performance of solid-state imaging devices, such as an increase in the pixel density, an increase in the resolution, a reduction in mixing of colors in color imaging, and an increase in the sensitivity, are constantly demanded. To meet these demands, technological innovations have been made in order to achieve a higher resolution in solid-state imaging devices by increasing the pixel density or the like.

FIG. 9A and FIG. 9B illustrate a solid-state imaging device according to a known example.

FIG. 9A is a diagram illustrating a cross-sectional structure of a solid-state imaging device according to a known example in which one pixel is formed in one island-shaped semiconductor (see, for example, International Publication No. 2009/034623). As illustrated in FIG. 9A, in an island-shaped semiconductor 100 that constitutes this pixel, a signal line $N^+$ region 102 (hereinafter, an "$N^+$ region" indicates a semiconductor region containing a donor impurity in large amounts) is formed on a substrate 101. On this signal line $N^+$ region 102, a P region 103 (hereinafter, a semiconductor region containing an acceptor impurity is referred to as a "P region") is formed. At an outer periphery portion of this P region 103, an insulating layer 104 is formed. A gate conductor layer 105 is formed with this insulating layer 104 interposing. At the outer periphery portion of the P region 103 above this gate conductor layer 105, an N region (hereinafter, a semiconductor region containing a donor impurity is referred to as an "N region") 106 is formed. On this N region 106 and the P region 103, a $P^+$ region (hereinafter, a semiconductor region containing an acceptor impurity in large amounts is referred to as a "$P^+$ region") 107 is formed. This $P^+$ region 107 is connected to a pixel selection line conductor layer 108. The above-described insulating layer 104 is formed so as to be continuous and surround the outer periphery portion of the island-shaped semiconductor 100. Similarly to this insulating layer 104, the gate conductor layer 105 is also formed so as to be continuous and surround the outer periphery portion of the island-shaped semiconductor 100.

In this solid-state imaging device, the P region 103 and the N region 106 constitute a photodiode region in the island-shaped semiconductor 100. When light is incident from the $P^+$ region 107 side in the island-shaped semiconductor 100, signal charges (free electrons in this case) are generated at a photoelectric conversion region of the photodiode region. These signal charges are then accumulated mainly in the N region 106 of the photodiode region.

Also, in the island-shaped semiconductor 100, a junction field-effect transistor is formed in which this N region 106 serves as a gate, the $P^+$ region 107 serves as a source, and the P region 103 in the vicinity of the signal line $N^+$ region 102 serves as a drain. In this solid-state imaging device, a drain-source current (an output signal) of the junction field-effect transistor changes in accordance with the amount of signal charges accumulated in the N region 106, and the drain-source current is output as a signal output via the signal $N^+$ region 102.

Furthermore, in the island-shaped semiconductor 100, a reset MOS transistor is formed in which the N region 106 of the photodiode region serves as a source, the gate conductor layer 105 serves as a reset gate, the signal line $N^+$ region 102 serves as a drain, and the P region 103 between the N region 106 and the signal line $N^+$ region 102 serves as a channel (hereinafter, this gate conductor layer 105 is referred to as a "reset gate conductor layer"). In this solid-state imaging device, signal charges accumulated in this N region 106 are discharged to the signal line $N^+$ region 102 as a result of application of an ON voltage (a high-level voltage) to the reset gate conductor layer 105 of the reset MOS transistor.

Here, it is assumed that the "high-level voltage" indicates a higher-level positive voltage in the case where signal charges are free electrons and a "low-level voltage" used hereinafter indicates a voltage lower than this "high-level voltage". On the other hand, it is assumed that, in the case where signal charges are positive holes, the "high-level voltage" indicates a lower-level negative voltage and the "low-level voltage" indicates a voltage that is closer to 0 V than the "high-level voltage".

An imaging operation of this solid-state imaging device is constituted by a signal charge accumulating operation, a signal charge reading operation, and a signal charge discharging operation. In the signal charge accumulating operation, signal charges generated at the photoelectric conversion region (the photodiode region) by light that is incident from the upper surface of the island-shaped semiconductor 100 are accumulated in the N region 106 in a state in which a ground voltage (=0 V) is applied to the signal line $N^+$ region 102, the reset gate conductor layer 105, and the $P^+$ region 107. In the signal charge reading operation, a source-drain current of the junction field-effect transistor modulated based on a potential of the N region 106 that changes in accordance with the amount of accumulated signal charges is read out as a signal current in a state in which the ground voltage is applied to the signal line $N^+$ region 102 and the reset gate conductor layer 105 and a positive voltage is applied to the $P^+$ region 107. In the resetting operation, the signal charges accumulated in the N region 106 are discharged to the signal line $N^+$ region 102 in a state in which the ground voltage is applied to the $P^+$ region 107 and a positive voltage is applied to the reset gate conductor layer 105 and the signal line $N^+$ region 102 after this signal charge reading operation.

FIG. 9B is a schematic plan view of the solid-state imaging device according to the known example. The solid-state imaging device includes a pixel region in which island-shaped semiconductors P11 to P33 (each of which corresponds to the island-shaped semiconductor 100 illustrated in FIG. 9A) each of which constitutes a pixel are two-dimensionally arranged, and driving and output circuits in the vicinity of this pixel region. The cross-sectional structure taken along a line F-F' in FIG. 9B is illustrated in FIG. 9A. On signal line $N^+$ regions 102a, 102b, and 102c (each of which corresponds to the signal line $N^+$ region 102 in FIG. 9A), the corresponding island-shaped semiconductors P11 to P33 constituting pixels are formed. Pixel selection line conductor layers 108a, 108b, and 108c (each of which corresponds to the pixel selection line conductor layer 108 in FIG. 9A) are formed for corresponding horizontal lines of these island-shaped semiconductors P11 to P33 so as to be continuous and are connected to a pixel selection line vertical scanning circuit 110 provided in the vicinity of the pixel region. Similarly to this, reset gate conductor layers 105a, 105b, and 105c (each of which corresponds to the gate conductor layer 105 in FIG. 9A) are formed for corresponding horizontal lines of the island-shaped semiconductors P11 to P33 constituting pixels so as to be continuous and are connected to a reset line vertical scanning circuit 112 provided in the vicinity of the pixel region. Lower portions of the signal line $N^+$ regions 102a, 102b, and 102c are connected to switch MOS transistors 115a, 115b, and 115c, respectively. Gates of the individual switch MOS transistors 115a, 115b, and 115c are connected to a signal line horizontal scanning circuit 116. Drains of the individual switch MOS transistors 115a, 115b, and 115c are connected to an output circuit 117. Upper portions of the signal line $N^+$ regions 102a, 102b, and 102c are connected to switch circuits 118a, 118b, and 118c, respectively. To the switch circuits 118a, 118b, and 118c, the ground voltage (=0 V) is applied during the signal charge accumulating operation, a floating voltage is applied during the signal charge reading operation, and a high-level voltage Vr for turning on resetting is applied during the signal charge discharging operation.

The signal charge accumulating operation is performed in a state in which the ground voltage is applied to the signal line $N^+$ regions 102a, 102b, and 102c, a low-level voltage for turning off resetting is applied to the reset gate conductor layers 105a, 105b, and 105c, and the ground voltage is applied to the pixel selection line conductor layers 108a, 108b, and 108c.

The signal charge reading operation is performed in the following manner. Source-drain currents of junction field-effect transistors of pixels subjected to reading are loaded to the output circuit 117 in a state in which a low-level voltage for turning off resetting is applied to the reset gate conductor layers 105a, 105b, and 105c, a high-level voltage is applied to the pixel selection line conductor layers 108a, 108b, and 108c of pixels from which signal charges are read out, an ON voltage (a high-level voltage) is applied to gates of the switch MOS transistors 115a, 115b, and 115c connected to the signal line $N^+$ regions 102a, 102b, and 102c of pixels from which signal charges are read out, voltages at the output terminals of the switch circuits 118a, 118b, and 118c are a floating voltage, and a voltage at an input terminal of the output circuit 117 is a low-level voltage.

Furthermore, the signal charge discharging operation is performed in the following manner. In a state in which all the pixel selection line conductor layers 108a, 108b, and 108c have the ground voltage and all the switch MOS transistors 115a, 115b, and 115c are off, a high-level voltage for turning on resetting is applied to the reset gate conductor layers 105a, 105b, and 105c that are connected to pixels, among the island-shaped semiconductors P11 to P33, from which accumulated signal charges are discharged. As a result of the application, the output terminals of the switch circuits 118a, 118b, and 118c come to have the high-level voltage Vr for turning on resetting.

As illustrated in FIG. 9A, a height of the island-shaped semiconductor 100 is determined mainly by a height Ld of the N layer 106 of the photodiode. Here, light is incident from the upper surface of the $P^+$ layer 107 of the island-shaped semiconductor 100. The generation rate of signal charges generated by this incident light has a characteristic that the generation rate exponentially decreases with respect to a depth Si from the upper surface of the $P^+$ layer 107. In order to efficiently extract signal charges that contribute to the sensitivity in solid-state imaging devices that detect visible light, a photoelectric conversion region needs to have a depth of 2.5 to 3 μm (see, for example, G. Agranov, R. Mauritzson, J. Ladd, A. Dokoutchaev, X. Fan, X. Li, Z. Yin, R. Johnson, V. Lenchenkov, S. Nagaraja, W. Gazeley, J. Bai, H. Lee, and Yoshinori Takizawa, "Reduction in Pixel Size and Characteristic Comparison of CMOS Image Sensor (CMOS Imeeji Sensa no Gaso Saizu Shukushou to Tokusei Hikaku)", ITE Technical Report, Vol. 33, No. 38, pp. 9-12 (September 2009)). For this reason, the height Ld of the N layer 106 of the photoelectric conversion photodiode needs to be at least 2.5 to 3 μm. The reset gate conductor layer 105 is formed below this N layer 106. Even the reset gate conductor layer 105 having a height of, for example, 0.1 μm successfully performs an expected operation of the solid-state imaging device. Thus, the reset gate conductor layer 105 is formed at a region near the bottom portion of the island-shaped semiconductor 100.

As illustrated in FIG. 9B, because the reset gate conductor layers 105a, 105b, and 105c are formed independently for each line, the reset gate conductor layers 105a, 105b, and 105c need to be formed at the bottom portions of the island-shaped semiconductors P11 to P33 in which the height of 2.5 to 3 μm is ensured. As integration of pixels increases, finer patterning is needed in formation of these reset gate conductor layers 105a, 105b, and 105c, which makes it difficult to fabricate this solid-state imaging device.

FIG. 10A and FIG. 10B are a schematic diagram of a pixel of a CMOS (Complementary Metal Oxide Semiconductor) solid-state imaging device and a diagram of changes in operation potentials, respectively. FIG. 10A is a schematic diagram of a pixel as illustrated in FIG. 1 of H. Takahashi, M. Kinoshita, K. Morita, T. Shirai, T. Sato, T Kimura, H. Yuzurihara, S. Inoue, and S. Matsumoto, "A 3.9-μm Pixel Pitch VGA Format 10-b Digital Output CMOS Image Sensor With 1.5 Transistor/Pixel", IEEE Journal of Solid-State Circuit, Vo. 39, No. 12, pp. 2417-2425 (2004). In a region A enclosed by a dotted line in FIG. 10A, one pixel is formed. In this figure, an N region 121 that constitutes a photodiode and a $P^+$ region 122 on this N region 121 are formed in a P region 120. A gate insulating layer 124 is formed on the P region 120. On this gate insulating layer 124, a transfer electrode ΦT is formed so as to be adjacent to the N region 121. An $N^+$ region 123 is formed on a surface of the P region 120 so as to be adjacent to this transfer electrode ΦT. A potential of the $P^+$ region 122 is fixed to a ground potential. The P region 120 and the N region 121 constitute a photodiode. With this configuration, a transfer MOS transistor M1 is formed in which the N region 121 serves as a source, the $N^+$ region 123 serves as a drain, and the transfer electrode ΦT serves as a gate. A source of a reset MOS transistor M2 and a gate of an amplifying MOS transistor M3 are connected to the $N^+$ region 123. A drain of the reset MOS transistor M2 and a source of the amplifying MOS transistor M3 are connected to a power voltage line VDD. Also, a source of a column selecting MOS transistor M4 is connected to a drain of the amplifying MOS transistor M3, whereas a drain of the column selecting MOS transistor M4 is connected to a signal line 125.

In this pixel, light that is incident from the $P^+$ region 122 side undergoes photoelectric conversion at a photodiode region to generate signal charges (free electrons in this case). These signal charges are accumulated in the N region 121. An ON voltage (a high-level voltage) is then applied to the transfer electrode ΦT, and consequently the signal charges accumulated in the N region 121 are transferred to the $N^+$ region 123. As a result of such an operation, a gate electrode potential of the amplifying MOS transistor M3 changes in accordance with the amount of signal charges. In response to application of an ON voltage (a high-level voltage) to a gate electrode ΦS of the column selecting MOS transistor M4, a signal current modulated based on the gate electrode potential of the amplifying MOS transistor M3 flows from the power voltage line VDD to the signal line 125 via the amplifying MOS transistor M3 and the column selecting MOS transistor M4, and this signal current is read out as a pixel signal. In response to application of an ON voltage (a high-level voltage) to a gate electrode ΦR of the reset MOS transistor M2, the signal charges existing in the $N^+$ region 123 are discharged to the power voltage line VDD.

FIG. 10B is a diagram of changes in potential distributions in the photodiode N region 121, the transfer MOS transistor M1, and the reset MOS transistor M2 (see, for example, FIG. 2 of P. P. K. Lee, R. C. Gee, R. M. Guidash, T-H. Lee, and E. R. Fossum, "An Active Pixel Sensor Fabricated Using CMOS/CCD Process Technology" in Program IEEE Workshop on Charge-Coupled Devices and Advanced Image Sensors, (1995)). FIG. 10B (a) is a cross-sectional diagram of the photodiode constituted by the P region 120 and the N region 121, the transfer MOS transistor M1 region, and the reset MOS transistor M2 region. The $N^+$ region 123, which constitutes a floating diode FD, is adjacent to a gate electrode Tx (which corresponds to the transfer electrode ΦT in FIG. 10A) of the transfer MOS transistor M1. A reset electrode RST (which corresponds to the gate electrode ΦR of the reset MOS transistor M2 in FIG. 10A) of the reset MOS transistor M2 is adjacent to this $N^+$ region 123. An $N^+$ region 126, which serves as the drain of the reset MOS transistor M2 connected to the power voltage line VDD, is formed on the surface of the P region 120 so as to be adjacent to this reset electrode RST.

FIG. 10B (b) illustrates a potential distribution along a line G-G' in FIG. 10B (a) during the signal charge accumulating operation. A solid line represents the bottom of the potential of each region, whereas a hatched part represents charges (free electrons in this case). The N region 121 contains accumulated signal charges 128. The $N^+$ regions 123 and 126 contain many charges 129a and 129b (free electrons in this case). An OFF voltage (a low-level voltage) is applied to the transfer electrode Tx and the reset electrode RST so as to prevent the accumulated signal charges 128 from being transferred to the $N^+$ region 123 and the $N^+$ region 126 serving as the drain of the reset MOS transistor M2 from the photodiode N region 121.

FIG. 10B (c) illustrates a potential distribution when the signal charges 128 accumulated in the N region 121 of the photodiode is transferred to the $N^+$ region 123. This transfer is performed by applying an ON voltage (a high-level voltage) to the transfer electrode Tx. The accumulated signal charges 128 are transferred from the N region 121 to the $N^+$ region 123 through a surface layer of the P region 123 located below the transfer electrode Tx. During this transfer, signal charges 130a in the N region 121 decrease and signal charges 130c in the $N^+$ region 123 increase as illustrated in FIG. 10B (c). At the time when the signal charges 130a and 130b no longer exist, this signal charge transferring operation ends. The potential at the gate electrode of the amplifying MOS transistor M3 connected to the $N^+$ region 123 changes as a result of the transfer of the signal charges 128 to the $N^+$ region 123. In accordance with the amount of this potential change, a signal current that flows through the signal line 125 changes and is read out as a signal output during the signal charge reading operation.

After this signal charge reading operation, an ON voltage (a high-level voltage) is applied to the gate electrode RST of the reset MOS transistor M2 so as to discharge the signal charges 130c in the floating diode $N^+$ region 123 to the $N^+$ region 126, which is the drain of the reset MOS transistor M2, as illustrated in FIG. 10B (d). During this signal charge discharging operation, the potential of the $N^+$ region 123 is reset and becomes equal to a potential 131 of the surface layer of the P region 120 located below the reset electrode RST.

As described above, the transfer MOS transistor M1 and the reset MOS transistor M2 are needed in each pixel in the solid-state imaging device having the pixels illustrated in FIG. 10A. The presence of such transfer MOS transistor M1 and reset MOS transistor M2 leads to a decrease in the pixel integration.

Referring to FIG. 11A and FIG. 11B, a signal charge discharging operation in a CCD (Charge Coupled Device) solid-state imaging device will be described below. FIG. 11A illustrates a cross-sectional structure of one pixel of a CCD solid-state imaging device (see, for example, FIG. 1 of I. Murakami, T. Nakano, K. Hatano, Y. Nakashiba, M. Furumiya, T. Nagata, T. Kawasaki, H. Utsumi, S. Uchiya, K. Arai, N. Mutoh, A. Kohno, N. Teranishi, and Y. Hokari, "Technologies to Improve Photo-Sensitivity and Reduce VOD Shutter Voltage for CCD Image Sensors", IEEE Transactions on Electron Devices, Vol. 47, No. 8, pp. 1566-1572 (2000)). A P region well 141 is formed on an N region substrate 140. On this P region well 141, an N region 142 is formed. The P region well 141 and the N region 142 constitute a photodiode portion. On this N region 142, a $P^+$ region 143 is formed. This $P^+$ region 143 is set to have a ground voltage (=0 V). A CCD portion is formed to be adjacent to the photodiode portion. On a surface of the P region well 141 in the CCD portion, a P region 144 and an N region 145 are formed which serve as a channel of this CCD portion. On a surface layer of the P region well 141 between the channel of this CCD portion and the photodiode N region 142, a transfer channel 146 for transferring signal charges accumulated in the photodiode portion to the N region 145 of the channel of the CCD portion is formed. On the $P^+$ region 143, the transfer channel 146, and the N region 145 of the channel of the CCD portion, an insulating film 147 is formed. Inside the insulating film 147 in the CCD portion, a CCD transfer electrode 148 is formed, above which a light-shielding metal layer 149 is formed so as to cover the CCD portion. Above the photodiode portion and the CCD portion, a transparent resin microlens 150 is formed. One pixel is constituted by the photodiode portion and the CCD portion illustrated in FIG. 11A. These pixels are two dimensionally arranged all over a pixel region of the CCD solid-state imaging device. The N region substrate 140 and the P region well 141 are formed so as to be continuous all over the pixel region.

An operation of transferring signal charges accumulated in the above-described photodiode portion is performed by applying a certain voltage to the CCD transfer electrode 148. The signal charge discharging operation is performed by applying a high-level voltage to the N region substrate 140 after the signal charge accumulation operation to discharge the signal charges accumulated in the N region 142 to the N region substrate 140. Each of the signal charge accumulating operation and the signal charge discharging operation is simultaneously performed in the pixels in the entire pixel region and the signal charge accumulating period is altered, whereby the timing of a shutter operation can be changed. This shutter operation is called an electronic shutter.

FIG. 11B illustrates potential distributions at the time of discharging of signal charges along a line H-H' in FIG. 11A (see FIG. 14 of I. Murakami, T. Nakano, K. Hatano, Y. Nakashiba, M. Furumiya, T. Nagata, T. Kawasaki, H. Utsumi, S. Uchiya, K. Arai, N. Mutoh, A. Kohno, N. Teranishi, and Y.

Hokari, "Technologies to Improve Photo-Sensitivity and Reduce VOD Shutter Voltage for CCD Image Sensors", IEEE Transactions on Electron Devices, Vol. 47, No. 8, pp. 1566-1572 (2000)). A potential of the P+ region 143 is fixed to a ground potential Vs (=0 V). During the signal charge accumulating operation, a potential distribution 151a is obtained in which a low-level voltage VRL is applied to the N region substrate 140. During this operation, signal charges 152a (in this figure, signal charges are represented by "e−" described in P. P. K Lee, R. C. Gee, R. M. Guidash, T-H. Lee, and E. R. Fossum, "An Active Pixel Sensor Fabricated Using CMOS/CCD Process Technology" in Program IEEE Workshop on Charge-Coupled Devices and Advanced Image Sensors, (1995), and are equivalent to the signal charges 128, 130a, 130b, and 130c illustrated as the hatched parts in FIG. 10B), which are generated by light radiated from the microlens 150 side, are accumulated in a potential well of the N region 142 and the P region well 141. During the signal charge discharging operation, a potential distribution 152b is obtained in which a high-level voltage VRH is applied to the N region substrate 140. The potential deepens towards the N region substrate 140 from the P+ region 143 having the ground potential. In this manner, accumulated signal charges 152b are discharged to the N region substrate 140.

In the above-described signal charge accumulating operation, signal charges generated in the potential well are effective as a signal, whereas signal charges generated in the P region well 141 and the N region substrate 140 that are located below the potential well are ineffective as a signal because they are discharged to the N region substrate 140. As described in International Publication No. 2009/034623, a depth Lph of this potential well is set to be 2.5 to 3 μm to meet the required spectral sensitivity characteristics. Further, it is undesirable that a potential barrier is caused during transfer of the signal charges 151 from the P+ region 143 to the N region substrate 140 in the potential distribution at the time of the signal charge discharging operation. Accordingly, the voltage VRH applied to the N region substrate 140 is set to be 18 to 30 V because the photoelectric conversion region constituted by the N region 142 and the P region well 141 overlaps the signal charge discharging region constituted by the P region well 141 and the N region substrate 140. This voltage is a significantly large value compared with the fact that the operation can be performed by applying a voltage of 2 to 3 V to the reset gate conductor layer 105 and to the gate electrode ΦR of the reset MOS transistor M2 at the time of discharging the signal charges in the solid-state imaging devices illustrated in FIGS. 9A and 10A. Due to this high voltage, the power consumption of the CCD solid-state imaging device increases.

The solid-state imaging devices illustrated in FIG. 9A and FIG. 10A, which read out pixel signals by using the X-Y address (dot sequential) method and the row address (line sequential) method, are unable to perform the pixel-signal charge reading operation and the pixel-signal-charge discharging operation simultaneously in pixels in the entire pixel region. For this reason, these solid-state imaging devices are unable to perform the signal charge discharging operation (the electronic shutter operation) of the above-described CCD solid-state imaging device. In order to perform this signal charge discharging operation (the electronic shutter operation), the CMOS solid-state imaging device illustrated in FIG. 10A needs to additionally include special transistors as described above (see, for example, K. Yasutomi, T. Tamura, F. Furuta, S. Itho, and S. Kawahito, "A High-Speed CMOS Image Sensor with Global Electronic Shutter Pixel Using Pinned Diodes", IEEJ Trans. SM, Vol. 129, No. 10, pp. 321-327 (2009)). Addition of such transistors decreases the pixel integration.

In the solid-state imaging device illustrated in FIG. 9A in which one pixel is formed in one island-shaped semiconductor, the height of the island-shaped semiconductor 100 is determined mainly by the height Ld of the N layer 106 of the photodiode. The generation rate of signal charges generated by radiation of light has a characteristic that the generation rate exponentially decreases with respect to the depth Si from the upper surface of the P+ layer 107. In order to efficiently extract signal charges that contribute to the sensitivity in solid-state imaging devices that detect visible light, the photoelectric conversion region needs to have a depth of 2.5 to 3 μm (see, for example, G. Agranov, R. Mauritzson, J. Ladd, A. Dokoutchaev, X. Fan, X. Li, Z. Yin, R. Johnson, V. Lenchenkov, S. Nagaraja, W. Gazeley, J. Bai, H. Lee, and Yoshinori Takizawa, "Reduction in Pixel Size and Characteristic Comparison of CMOS Image Sensor (CMOS Imeeji Sensa no Gaso Saizu Shukushou to Tokusei Hikaku)", ITE Technical Report, Vol. 33, No. 38, pp. 9-12 (September 2009)). For this reason, the height Ld of the N layer 106 of the photoelectric conversion photodiode needs to be at least 2.5 to 3 μm. The reset gate conductor layer 105 is formed below this N layer 106. Even the reset gate conductor layer 105 having a height of, for example, 0.1 μm successfully operates. Thus, the reset gate conductor layer 105 is formed substantially at the bottom portion of the island-shaped semiconductor 100. As illustrated in FIG. 9B, because the reset gate conductor layers 105a, 105b, and 105c are formed independently for each line, the reset gate conductor layers 105a, 105b, and 105c need to be formed at the bottom portions of the island-shaped semiconductors P11 to P33 having the height of 2.5 to 3 μm. As integration of pixels increases, the presence of such reset gate conductor layers 105a, 105b, and 105c makes it more difficult to fabricate this solid-state imaging device.

The CMOS solid-state imaging device that includes the pixels illustrated in FIG. 10A requires the reset MOS transistor M2 in each pixel. The presence of this reset MOS transistor M2 decreases the pixel integration.

In the CCD solid-state imaging device illustrated in FIG. 11A, the depth Lph of the potential well that accumulates signal charges as illustrated in FIG. 11B is set to be 2.5 to 3 μm to meet the required spectral sensitivity characteristics as disclosed in G. Agranov, R. Mauritzson, J. Ladd, A. Dokoutchaev, X. Fan, X. Li, Z. Yin, R. Johnson, V. Lenchenkov, S. Nagaraja, W. Gazeley, J. Bai, H. Lee, and Yoshinori Takizawa, "Reduction in Pixel Size and Characteristic Comparison of CMOS Image Sensor (CMOS Imeeji Sensa no Gaso Saizu Shukushou to Tokusei Hikaku)", ITE Technical Report, Vol. 33, No. 38, pp. 9-12 (September 2009). Further, it is required that a potential barrier is not caused during transfer of the signal charges 151 from the P+ region 143 to the N region substrate 140 in the potential distribution at the time of the signal charge discharging operation. Accordingly, the voltage VRH applied to the N region substrate 140 is required to be a high voltage, such as 18 to 30 V. This increases the power consumption of the CCD solid-state imaging device.

SUMMARY OF THE INVENTION

The present invention is made in view of the above-described circumstances and aims to realize solid-state imaging devices in which the pixel density is increased, the power consumption is reduced, and the light leakage is reduced.

According to an aspect of the present invention, there is provided a solid-state imaging device including a pixel region in which a plurality of pixels is two-dimensionally arranged. Each of the plurality of pixels includes a first semiconductor region formed on a substrate; a second semiconductor region formed on the first semiconductor region; a third semiconductor region formed on an upper side surface of the second semiconductor region; a fourth semiconductor region formed on a side surface of the third semiconductor region, in which the side surface is not facing the side surface of the second semiconductor region, the fourth semiconductor region having a conductivity opposite to a conductivity of the third semiconductor region; and a fifth semiconductor region formed above the second semiconductor region, the fifth semiconductor region having a conductivity opposite to the conductivity of the third semiconductor region. The second semiconductor region is constituted by a semiconductor having a conductivity opposite to the conductivity of the third semiconductor region or by an intrinsic semiconductor. At least an upper portion of the second semiconductor region, the third semiconductor region, the fourth semiconductor region, and the fifth semiconductor region form an island-shaped semiconductor. The second semiconductor region and the third semiconductor region form a photodiode. A signal charge accumulating operation is performed in which signal charges generated by an electromagnetic energy wave that is incident on a region of the photodiode are accumulated in the third semiconductor region. A junction field-effect transistor is formed in which one of the first semiconductor region and the fifth semiconductor region serves as a drain, the other one of the first semiconductor region and the fifth semiconductor region serves as a source, and the third semiconductor region in which signal charges are accumulated serves as a gate. A pixel signal reading operation is performed in which a current that flows between the source and the drain of the junction field-effect transistor in accordance with an amount of signal charges accumulated in the third semiconductor region is read out as a signal output. A signal charge discharging operation is performed in which the fourth semiconductor region and the fifth semiconductor region are set to have a low-level voltage and the first semiconductor region is set to have a high-level voltage that is higher than the low-level voltage so as to remove a potential barrier in the second semiconductor region located between the first semiconductor region and the third semiconductor region, and in which signal charges accumulated in the third semiconductor region are discharged from the third semiconductor region to the first semiconductor region via the second semiconductor region without the potential barrier. The pixels are two-dimensionally arranged. An operation is performed in which signal currents of pixels arranged in at least one row among the two-dimensionally arranged pixels are simultaneously read out to a row pixel signal loading circuit that is provided outside the pixel region via signal lines that are arranged along columns of the pixels arranged in the vertical direction and that are connected to the first semiconductor regions, and in which signal outputs from the pixels arranged in the at least one row are read out via an output circuit included in the row pixel signal loading circuit. In a period during which the signal charge discharging operation is performed, the low-level voltage is applied to a pixel selection line connected to the fifth semiconductor regions of the pixels arranged in the at least one row and the high-level voltage is applied to pixel selection lines connected to pixels arranged in the other rows. In a high-level voltage application period during which the high-level voltage is applied, a high-level voltage is applied to the signal lines connected to the columns of the pixels.

The fourth semiconductor region may preferably be connected to the fifth semiconductor region.

The third semiconductor region and the fourth semiconductor region may preferably be separated from the fifth semiconductor region. A first conductor layer may preferably be formed at an outer periphery portion of the fourth semiconductor region with an insulating layer interposing therebetween. In a period during which signal charges accumulated in the third semiconductor region are discharged to the first semiconductor region, the fourth semiconductor region may preferably have a low-level voltage that is lower than the high-level voltage, a high-level voltage may preferably be applied to the first semiconductor region, and a certain voltage that allows the signal charges to be accumulated may preferably be applied to the first conductor layer.

The first semiconductor region may preferably include a sixth semiconductor region that serves as the source or the drain of the junction field-effect transistor, and a seventh semiconductor region to which signal charges accumulated in the third semiconductor region are discharged. The second semiconductor region may preferably extend between the sixth semiconductor region and the seventh semiconductor region.

A voltage that is applied to the seventh semiconductor region in a period during which the signal charge accumulating operation and the pixel signal reading operation are performed may preferably be set to be lower than a voltage that is applied to the seventh semiconductor region in a period during which the signal charge discharging operation is performed.

An insulating layer may preferably be formed so as to surround the second semiconductor region, the third semiconductor region, and the fourth semiconductor region, and a light-shielding conductor layer may preferably be formed so as to surround the insulating layer.

The light-shielding conductor layer may preferably be formed on side surfaces of the island-shaped semiconductors of the pixels arranged in the pixel region so as to be continuous all over the pixel region.

The light-shielding conductor layer may preferably be formed on the pixels arranged in the pixel region so as to be continuous all over the pixel region, and a ground voltage or the low-level voltage may preferably be applied to the light-shielding conductor layer.

The light-shielding conductor layer may preferably be connected to the pixels arranged in the pixel region and be formed all over the pixel region. The high-level voltage may preferably be applied to the light-shielding conductor layer in the period during which the signal charge discharging operation is performed so that a period during which the high-level voltage is applied to the light-shielding conductor layer partially or entirely overlaps a period during which the high-level voltage is applied to the signal lines. The ground voltage or the low-level voltage may preferably be applied to the signal lines during a period other than the period during which the signal charge discharging operation is performed.

The light-shielding conductor layer may preferably be formed so as to surround the insulating layer formed on outer peripheries of the second semiconductor region, the third semiconductor region, and the fourth semiconductor region, and is formed in a divided manner at two or more separate sites.

The light-shielding conductor layer may preferably be connected to the fifth semiconductor region.

According to the aspect of the present invention, a reset conductor layer is no longer needed in a solid-state imaging device, and consequently the pixel integration improves and fabrication of the solid-state imaging device becomes easier.

Also, a reset MOS transistor is no longer needed in each pixel of a CMOS solid-state imaging device, and consequently the pixel integration improves and the voltage applied during the signal charge discharging operation lowers.

BRIEF DESCRIPTION OF THE DRAWINGS

FIG. 1B illustrates potential distributions along a line A-A' illustrated in FIG. 1A during a signal charge accumulating operation and a signal charge discharging operation performed in the solid-state imaging device according to the first embodiment;

FIG. 2A is a schematic plan view of a solid-state imaging device according to a second embodiment of the present invention;

DETAILED DESCRIPTION OF THE PREFERRED EMBODIMENTS

Figure 1A:
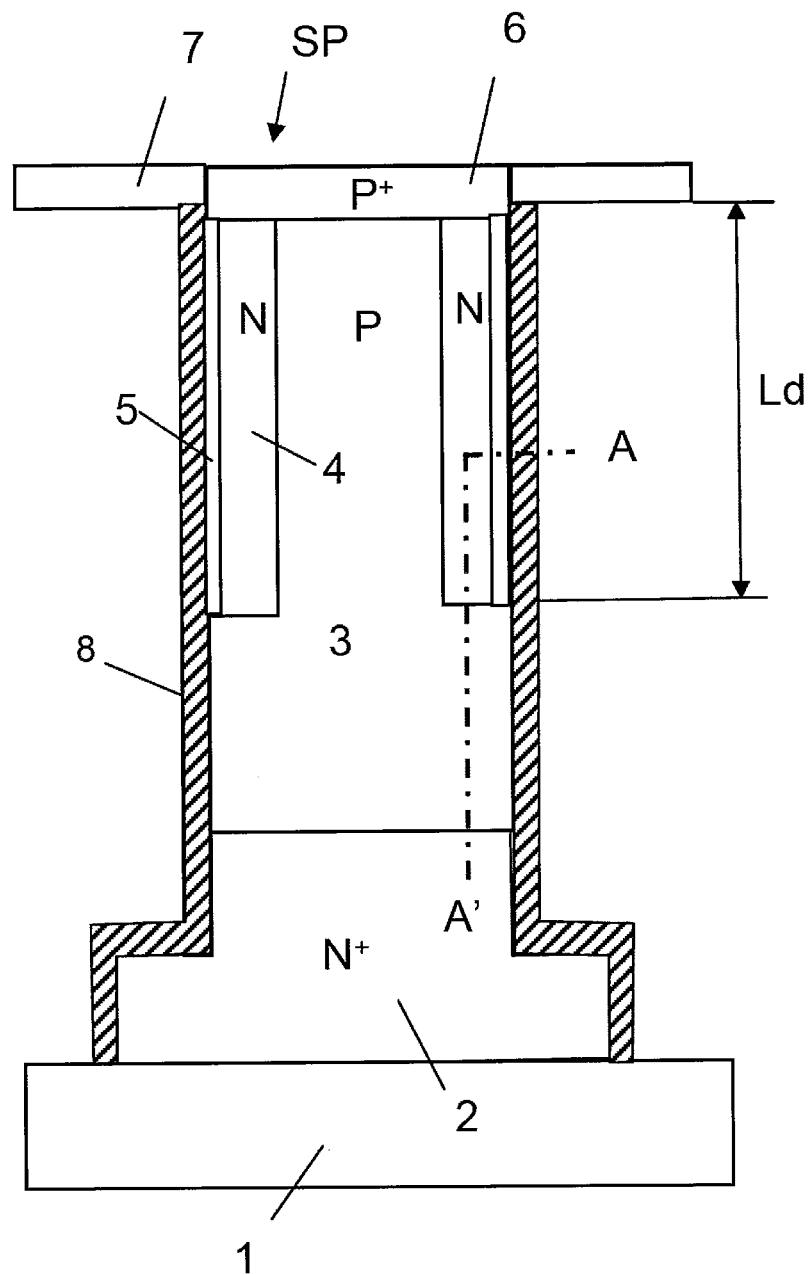
FIG. 1A is a diagram illustrating a cross-sectional structure of a pixel of a solid-state imaging device according to a first embodiment of the present invention.

Referring to the drawings, solid-state imaging devices according to embodiments of the present invention will be described below.

First Embodiment

FIG. 1A and FIG. 1B illustrate a solid-state imaging device according to a first embodiment. FIG. 1A is a diagram illustrating a cross-sectional structure of one pixel of the solid-state imaging device. A signal line $N^+$ region 2 is formed on a substrate 1. On this signal line $N^+$ region 2, an island-shaped semiconductor SP is formed. On the signal line $N^+$ region 2, a P region 3 is formed in the island-shaped semiconductor SP. At an upper outer periphery portion of this P region 3, an N region 4 is formed. On a side surface of the island-shaped semiconductor SP, a $P^+$ region 5 is formed so as to surround this N region 4. A $P^+$ region 6, which is connected to this $P^+$ region 5, is formed on an upper surface of the island-shaped semiconductor SP. A pixel selection line conductor layer 7 is connected to the $P^+$ region 6. An insulating layer 8 is formed so as to surround outer periphery portions of the signal line $N^+$ region 2 and the island-shaped semiconductor SP. The solid-state imaging device according to this invention does not include the reset conductor layer 105, which is needed in the solid-state imaging device according to the known example illustrated in FIG. 9A. Also, the $P^+$ region 5 formed at the outer periphery portion of the N region 4 is connected to the $P^+$ region 6 of the island-shaped semiconductor SP.

In this solid-state imaging device, the P region 3 and the N region 4 constitute a photodiode region. In response to radiation of incident light from the $P^+$ region 6 side of the island-shaped semiconductor SP, signal charges (free electrons in this case) are generated in the photodiode region. These signal charges are accumulated mainly in the N region 4 of the photodiode region. Also, in the island-shaped semiconductor SP, a joint field-effect transistor is formed in which this N region 4 serves as a gate, the $P^+$ region 6 serves as a source, and the P region 3 in the vicinity of the signal line $N^+$ region 2 serves as a drain. A drain-source current (an output signal) of the joint field-effect transistor changes in accordance with the amount of signal charges accumulated in the N region 4, and is read out as a signal output via the signal line $N^+$ region 2. The signal charges accumulated in this N region 4 are discharged to the signal line N⁺ region 2 by setting the P⁺ region 6 to have a ground potential (=0 V) and applying a high-level voltage to the signal line N⁺ region 2.

FIG. 1B illustrates potential distributions along a line A-A' in FIG. 1A during a signal charge accumulating operation and a signal charge discharging operation. FIG. 1B (a) illustrates an enlarged sectional view taken along the line A-A' in FIG. 1A. On one side of the P region 3, the N region 4 constituting a photodiode and the P⁺ region 5 connected to the P⁺ region 6 are formed, whereas on the other side, the signal line N⁺ region 2 is formed. The insulating layer 8 is formed on the P⁺ region 5, the signal line N⁺ region 2, and the P region 3 located therebetween.

FIG. 1B (b) illustrates a potential distribution 9a obtained during the signal charge accumulating operation. This potential distribution 9a shows a potential at a bottom portion of a conduction band in which free electrons serving as signal charges exist or move. During this signal charge accumulating operation, potentials of the P⁺ region 5 and the signal line N⁺ region 2 are set to be a ground potential (=0 V). Also, many free electrons 11a exist in the signal line N⁺ region 2. The potential distribution 9a is created which has a potential well in the N region 4 of the photodiode. At this time, signal charges 10a generated by radiation of light are accumulated in the potential well and do not move to the signal line N⁺ region 2.

Figure 11A:
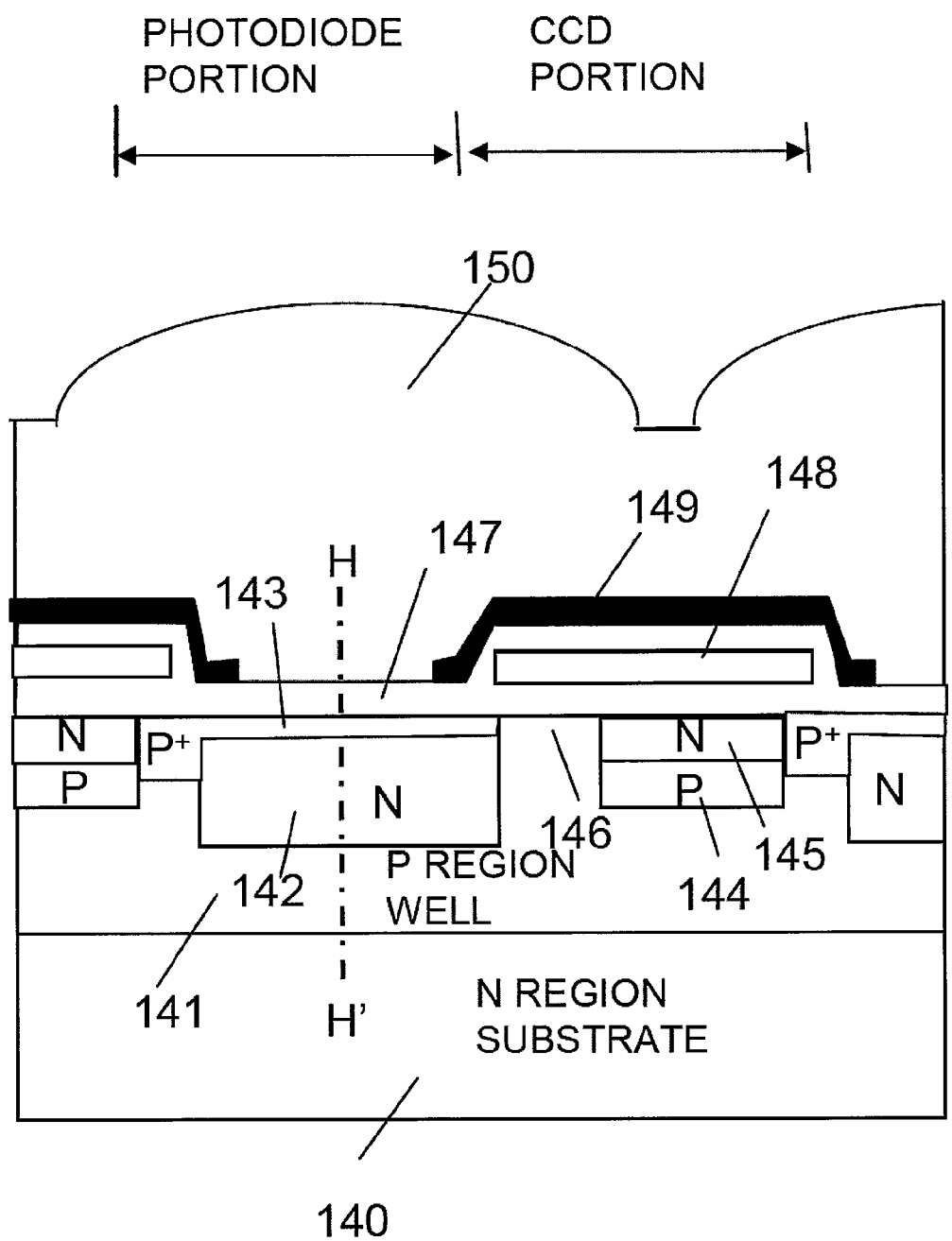
FIG. 11A is a diagram illustrating a cross-sectional structure of a pixel of a solid-state imaging device according to a known example.
Figure 11B:
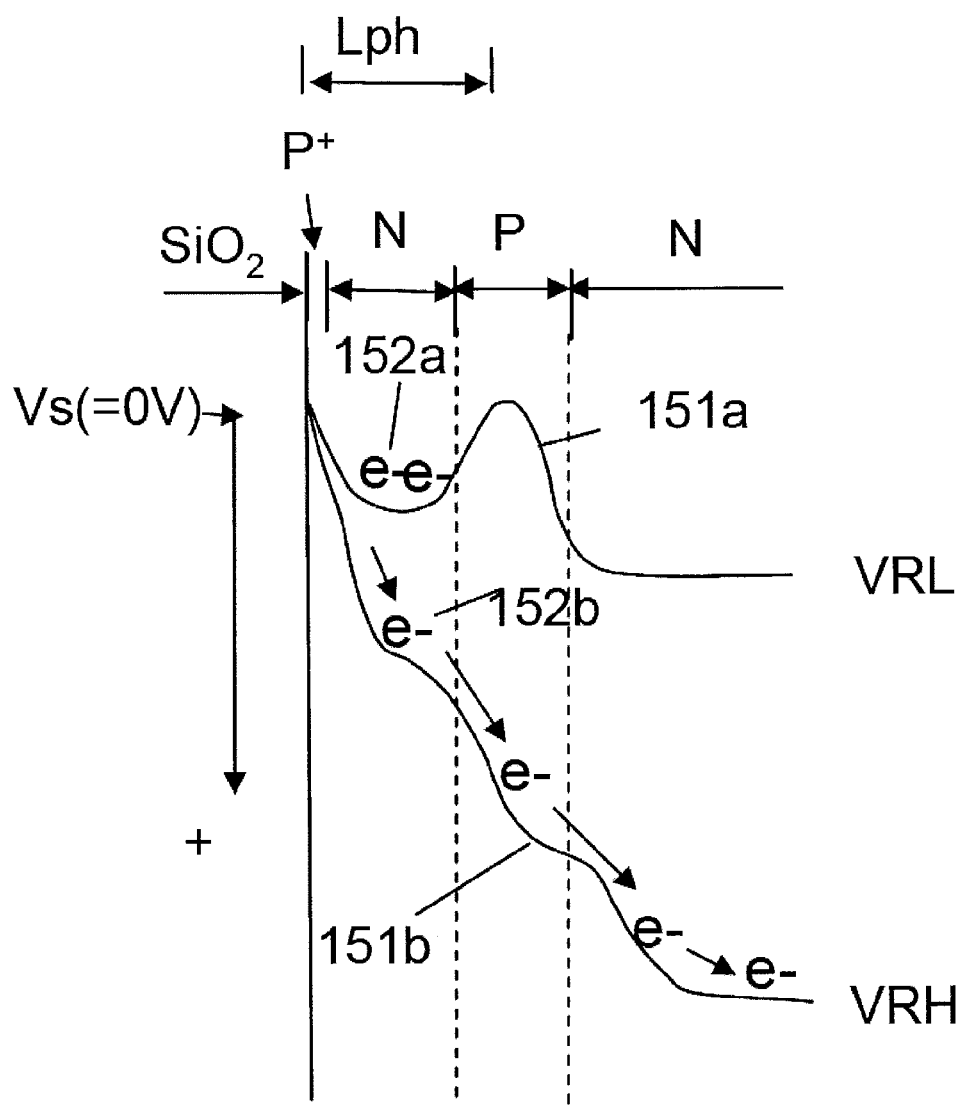
FIG. 11B is a diagram illustrating a change in a potential distribution during a signal charge accumulating operation and a signal charge discharging operation performed in the CCD solid-state imaging device according to the known example.

FIG. 1B (c) illustrates a potential distribution 9b obtained during the signal charge discharging operation. During this signal charge discharging operation, the potential of the P⁺ region 5 is set to be the ground potential and a high-level voltage Vrh is applied to the signal line N⁺ region 2. At this time, the potential distribution 9b is formed in which the potential rises toward the signal line N⁺ region 2 from the N region 4. With this potential distribution 9b, signal charges 10b in the N region 4 are discharged to the signal line N⁺ region 2. In the potential distribution 9b at the P region 3, which is located between the N region 4 and the signal line N⁺ region 2, no potential barrier is caused against movement of signal charges (free electrons). In the known example illustrated in FIG. 11A, a photoelectric conversion region constituted by the N region 142 and the P region well 141 overlaps a signal charge discharging region constituted by the P region well 141 and the N region substrate 140. In contrast, in this embodiment, a photoelectric conversion region is constituted by the N region 4 of the photodiode and a signal charge discharging region is constituted by the P region 3 located between the N region 4 and the signal line N⁺ region 2 as illustrated in FIG. 1A. Thus, regions where the photoelectric conversion region and the signal charge discharging region are formed do not overlap one another. Accordingly, the signal charge discharging region is constituted by the P region 3 located between the N region 4 and the signal line N⁺ region 2, and the potential distribution 9a (the potential well) illustrated in FIG. 1B (b) is created during the signal charge accumulating operation. Also, a length of the P region 3 located between this N region 4 and the signal line N⁺ region 2 can be shortened as much as possible as long as a condition that the potential at the P region 3 located between the N region 4 and the signal line N⁺ region 2 does not cause a potential barrier against movement of signal charges (free electrons) is satisfied as illustrated in FIG. 1B (c). This makes it possible to decrease the voltage Vrh applied to the signal line N⁺ region 2 compared with the CCD solid-state imaging device illustrated in FIG. 11A, i.e., to lower the voltage to, for example, 3 to 5 V. This thus makes it possible to perform the signal charge discharging operation while suppressing an increase in the power consumption of the solid-state imaging device according to this embodiment.

Figure 9A:
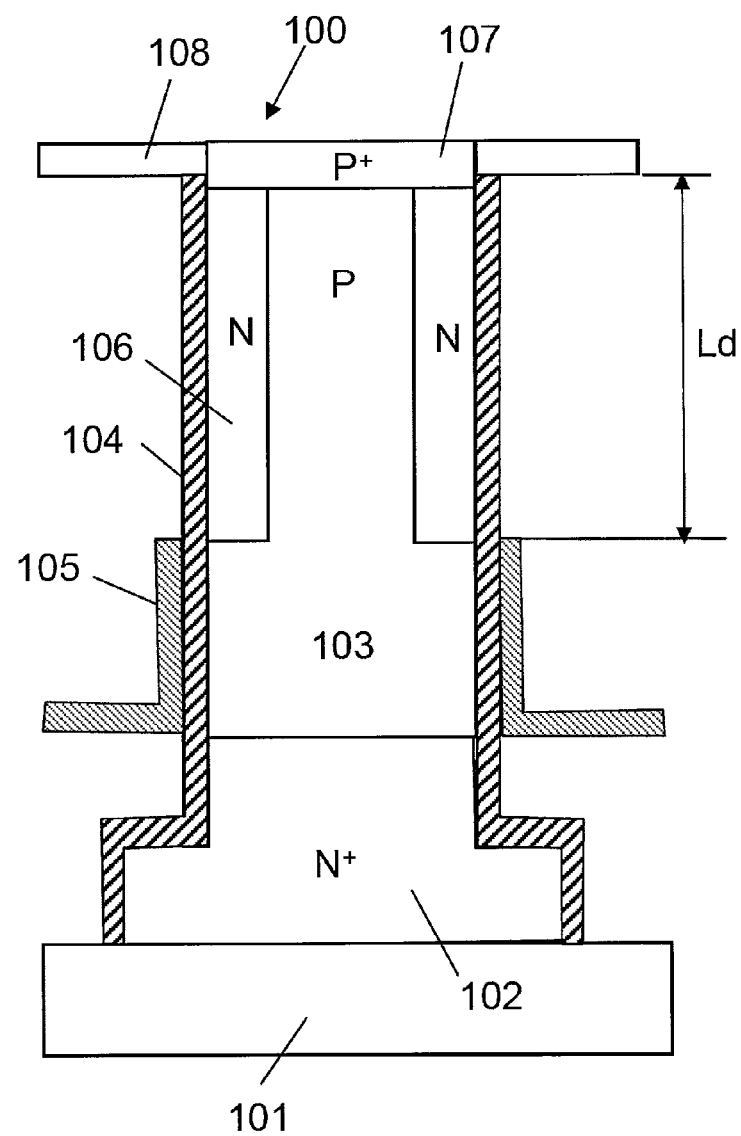
FIG. 9A is a diagram illustrating a cross-sectional structure of a pixel of a solid-state imaging device according to a known example.
Figure 9B:
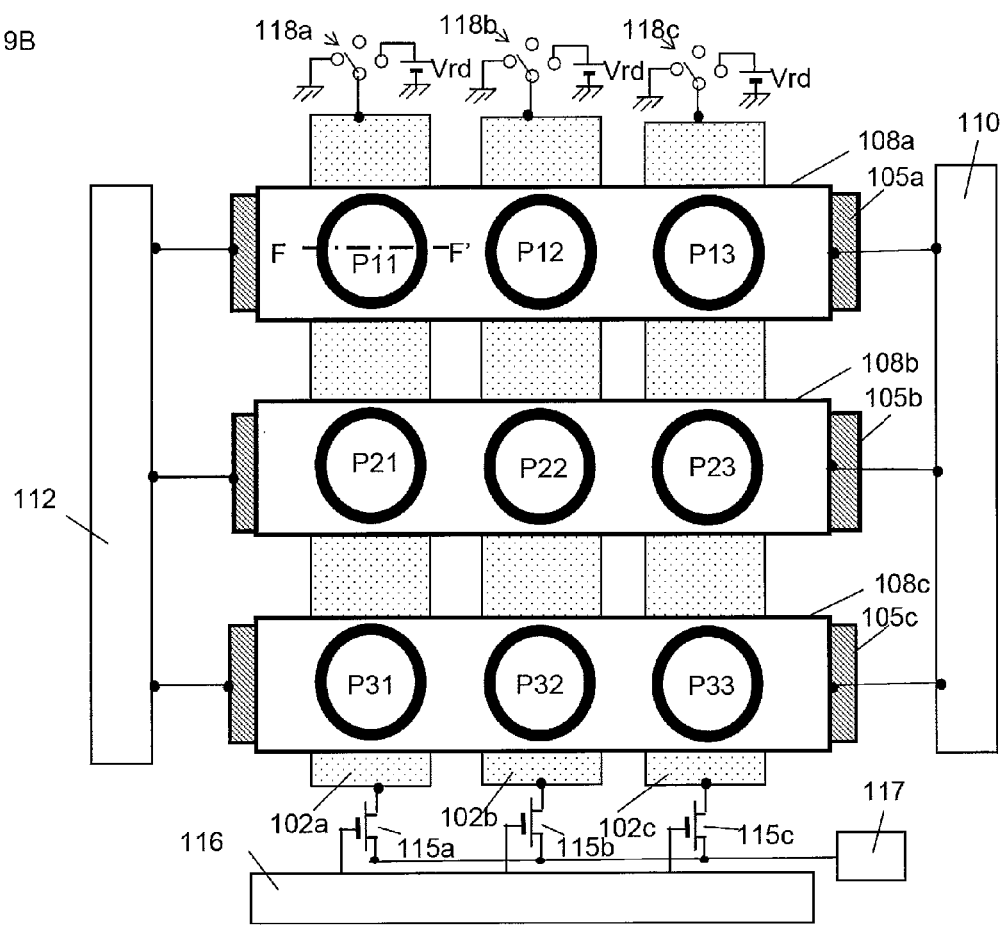
FIG. 9B is a schematic plan view of the solid-state imaging device according to the known example.
Figure 10A:
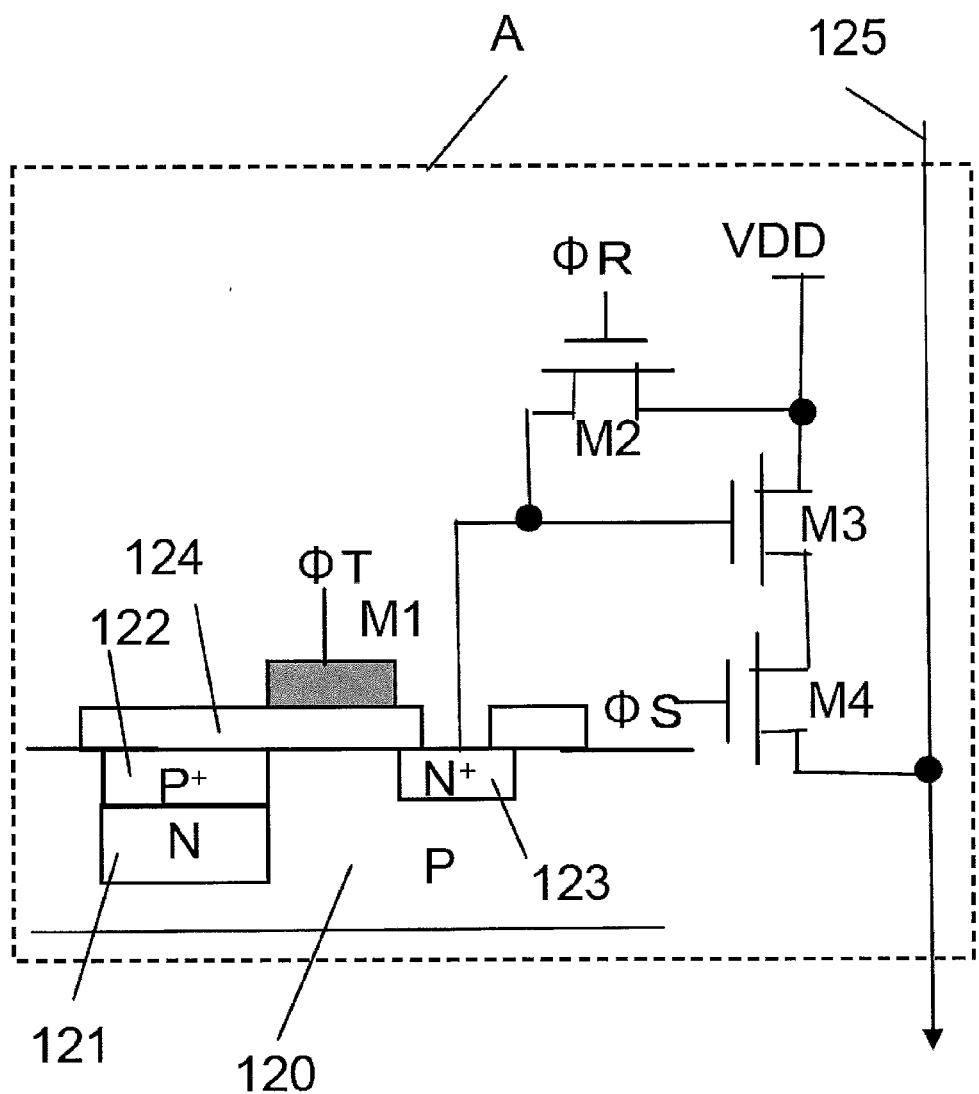
FIG. 10A is a schematic view of a pixel of a CMOS solid-state imaging device according to a known example.
Figure 10B:
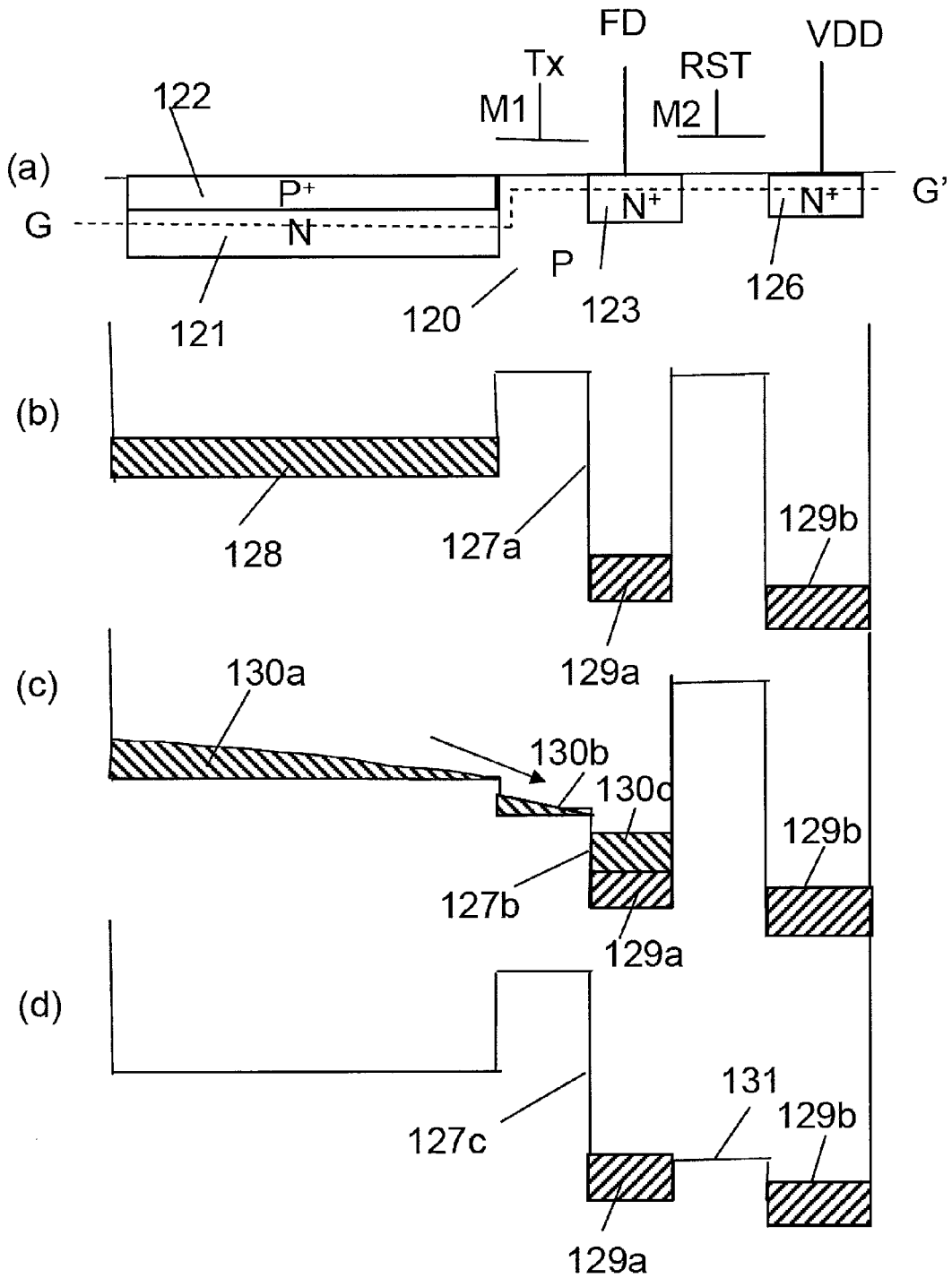
FIG. 10B is a diagram illustrating a change in a potential distribution during a signal charge accumulating operation and a signal charge discharging operation performed in the CMOS solid-state imaging device according to the known example.

Moreover, unlike the solid-state imaging device illustrated in FIG. 9A and FIG. 9B, the solid-state imaging device according to this embodiment does not need reset conductor layers 105, 105a, 105b, and 105c, which require finer patterning as the pixel integration increases, at bottom portions of the island-shaped semiconductor 100 and P11 to P33. This improves the pixel integration and makes fabrication of the solid-state imaging device easier. In one pixel of the solid-state imaging device according to the known example illustrated in FIG. 9A, the signal charge accumulating operation, the signal charge reading operation, and the signal charge discharging operation are performed by driving three terminals, namely, the signal line N⁺ layer 102, the P⁺ layer 107 connected to the pixel selection line conductor layer 108, and the reset gate conductor layer 105. However, in the solid-state imaging device according to this embodiment, the same operation sequence can be performed by driving two terminals, namely, the signal line N⁺ layer 2 and the P⁺ layer 6 connected to the pixel selection line conductor layer 7. As a result of this, the reset line vertical scanning circuit 112 provided in the vicinity of the pixel region in FIG. 9B is no longer needed. This consequently reduces the area of a semiconductor substrate on which the solid-state imaging device is formed and lowers the price of the solid-state imaging device. Furthermore, unlike the CMOS solid-state imaging device according to the known example illustrated in FIG. 10A, reset MOS transistors, which reduce the pixel integration, are no longer needed in the pixels in this embodiment.

Second Embodiment

Figure 2B:
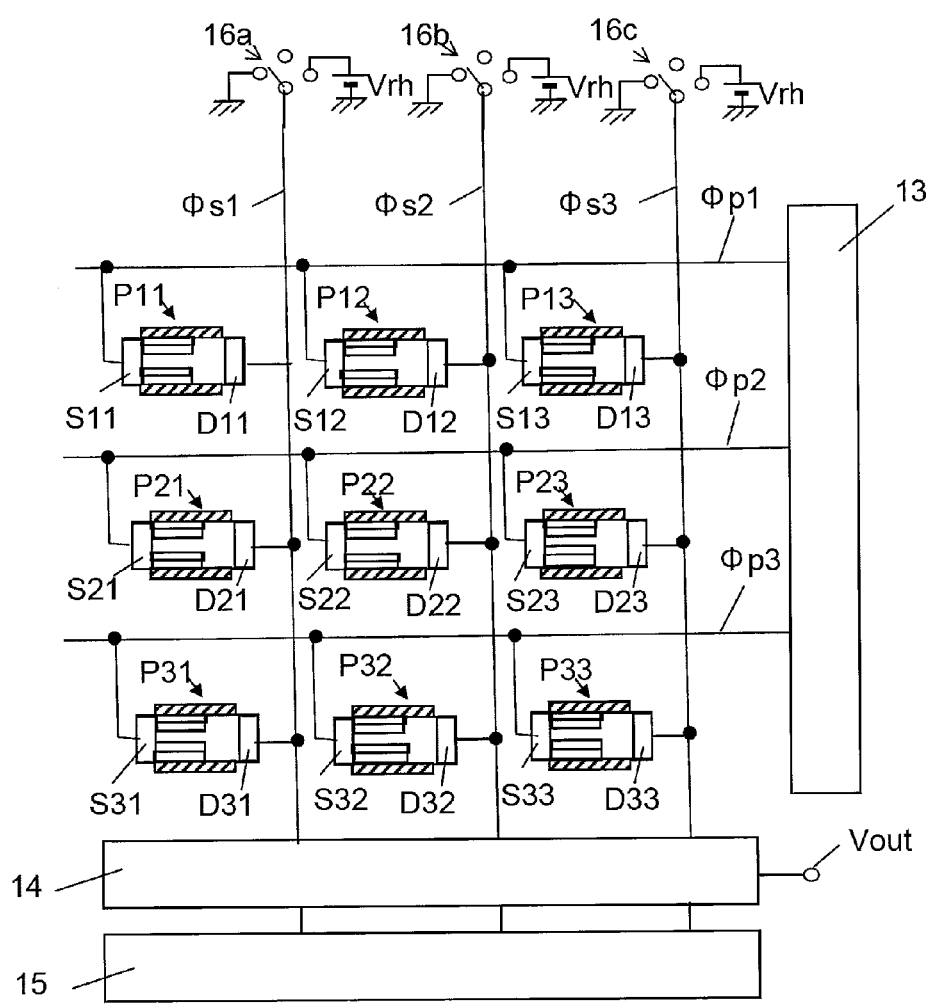
FIG. 2B is a schematic plan view of circuitry of the solid-state imaging device according to the second embodiment.
Figure 2C:
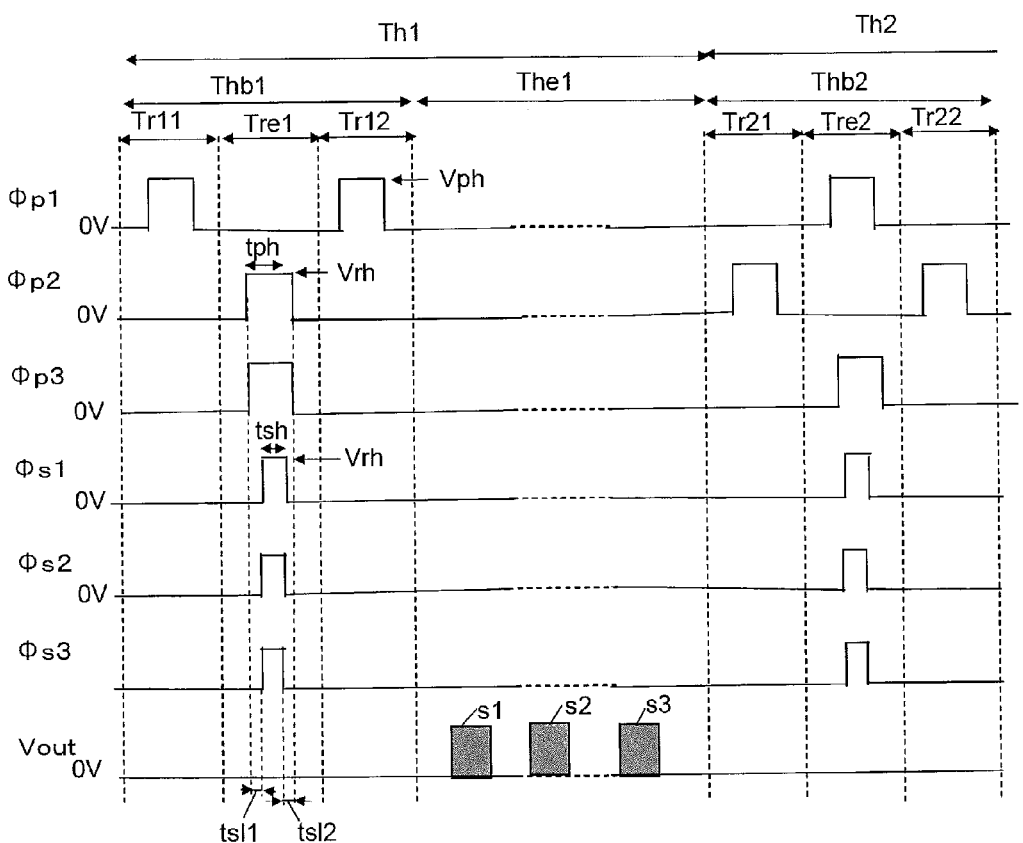
FIG. 2C is a voltage waveform diagram illustrating relationships among driving voltage waveforms applied to pixel selection lines Φp1 to Φp3 and to signal lines Φs1 to Φs3 and a voltage waveform at a signal output terminal Vout of the solid-state imaging device according to the second embodiment.

FIG. 2A to FIG. 2C illustrate a driving method of a solid-state imaging device according to a second embodiment.

FIG. 2A is a schematic plan view of the solid-state imaging device according to this embodiment. A cross-sectional structure taken along a line B-B' in the figure corresponds to FIG. 1A. Island-shaped semiconductors P11 to P33 (each of which corresponds to the island-shaped semiconductor SP in FIG. 1A) for 3×3 pixels are formed on corresponding signal line N⁺ layers 2a, 2b, and 2c (each of which corresponds to the signal line N⁺ layer 2 in FIG. 1A). Pixel selection line conductor layers 7a, 7b, and 7c (each of which corresponds to 7 in FIG. 1A) are formed for corresponding horizontal lines of the island-shaped semiconductors P11 to P33 so as to be continuous and are connected to a pixel selection line vertical scanning circuit 13 provided in the vicinity of the pixel region. Lower portions of the signal line N⁺ layers 2a, 2b, and 2c are connected to a row pixel signal loading/outputting circuit 14. This row pixel signal loading/outputting circuit 14 simultaneously loads signals from individual vertical columns of the island-shaped semiconductors P11 to P33. The row pixel signal loading/outputting circuit 14 is driven by a horizontal scanning circuit 15 connected thereto and sequentially reads out output signals from the individual pixel columns of the island-shaped semiconductors P11 to P33 via a signal output terminal 17 during a horizontal effective period. Also, switch circuits 16a, 16b, and 16c, to which a ground voltage (=0 V) is applied during the signal charge accumulating operation, a floating voltage is applied during the signal charge reading operation, and a high-level voltage Vrh for turning on resetting is applied during the signal charge discharging operation, are formed so as to be connected to upper portions of the signal line N⁺ regions 2a, 2b, and 2c, respectively.

FIG. 2B illustrates a schematic plan view of circuitry of the solid-state imaging device according to this embodiment. Signal lines Φs1, Φs2, and Φs3 are connected to N+ layers D11 to D33 (each of which corresponds to the signal line N+ layer 2 in FIG. 1A) of the island-shaped semiconductors P11 to P33 and to the row pixel signal loading/outputting circuit 14 and the switch circuits 16a, 16b, and 16c. Pixel selection lines Φp1, Φp2, and Φp3 (which correspond to the pixel selection line conductor layers 7a, 7b, and 7c in FIG. 2A, respectively) are connected to P+ layers S11 to S33 (each of which corresponds to the P+ layer 6 in FIG. 1A) of the island-shaped semiconductors P11 to P33 and to the pixel selection line vertical scanning circuit 13. Signals output from the row pixel signal loading/outputting circuit 14 are read out via a signal output terminal Vout (which corresponds to 17 in FIG. 2A). The island-shaped semiconductors P11 to P33 are driven by driving voltages that are applied to the pixel selection lines Φp1, Φp2, and Φp3 and the signal lines Φs1, Φs2, and Φs3.

FIG. 2C illustrates relationships among waveforms of driving voltages applied to the pixel selection lines Φp1, Φp2, and Φp3 and to the signal lines Φs1, Φs2, and Φs3 and a waveform of a voltage at the signal output terminal Vout. A first horizontal scanning period Th1 is followed by a second horizontal scanning period Th2. The first horizontal scanning period Th1 is constituted by a first ineffective blanking period Thb1 and a first effective period The1. During the first ineffective blanking period Thb1, pixel signals are loaded to the row pixel signal loading/outputting circuit 14 from the island-shaped semiconductors P11, P12, and P13 connected to the pixel selection line Φp1. The first ineffective blanking period Thb1 is constituted by a first pixel signal reading period Tr11 for reading out pixel signals of the pixels P11, P12, and P13 (during this period, accumulated signal charges of the island-shaped semiconductors P11, P12, and P13 are accumulated in the island-shaped semiconductors P11, P12, and P13, respectively); a signal charge discharging period Tre1 for discharging the accumulated signal charges of the island-shaped semiconductors P11, P12, and P13 to the signal lines Φs1, Φs2, and Φs3; and a second pixel signal reading period Tr12 for reading out pixel signals after signal charges of the island-shaped semiconductors P11, P12, and P13 are discharged. A differential signal between each pixel signal obtained during the first pixel signal reading period Tr11 and the corresponding pixel signal obtained during the second pixel signal reading period Tr12 is generated by, for example, a CDS (Correlated double sampling) circuit. During the first effective period The1, pixel signals s1, s2, and s3 of the island-shaped semiconductors P11, P12, and P13, respectively, are read out via the output terminal Vout. The above operation is performed during the second horizontal scanning period Th2 that follows the first horizontal scanning period Th1, whereby pixel signals of the island-shaped semiconductors P21, P22, and P23 are read out. By performing this operation in series, pixel signals of the island-shaped semiconductors P11 to P33 that constitute 3×3 pixels are obtained.

In the first signal charge discharging period Tre1, accumulated signal charges of the island-shaped semiconductors P11, P12, and P13 are discharged by applying the ground potential (=0 V) to the pixel selection line Φp1 and applying a reset high-level voltage Vrh to the signal lines Φs1, Φs2, and Φs3. In this case, it is required that accumulated signal charges of the island-shaped semiconductors P21, P22, P23, P31, P32, and P33 other than the island-shaped semiconductors P11, P12, and P13 are not discharged. Such a state is achieved by applying the high-level voltage Vrh to the pixel selection lines Φp2 and Φp3 during a period tph which includes the preceding and following periods of a period tsh during which the high-level voltage Vrh is applied to the signal line Φs1 in the first signal charge discharging period Tre1, and by applying the same high-level voltage Vrh to the signal lines Φs2 and Φs3 during the same period tsh as that of the signal line Φs1. During the preceding and following periods ts11 and ts12 of the signal charge discharging period tsh, respectively, the potentials of the pixel selection lines Φp2 and Φp3 are the high-level voltage Vrh and potentials of the signal lines Φs1, Φs2, and Φs3 are the ground voltage. In this case, currents of the joint field-effect transistors flow, via the signal lines Φs1, Φs2, and Φs3, into the switch circuits 16a, 16b, and 16c having the ground voltage, respectively, with accumulated signal charges of the island-shaped semiconductors P21, P22, P23, P31, P32, and P33 other than the island-shaped semiconductors P11, P12, and P13 being held in the corresponding island-shaped semiconductors P21, P22, P23, P31, P32, and P33. Then, in the period tph, because the high-level voltage Vrh is applied to the pixel selection lines Φp2 and Φp3 and the signal lines Φs2 and Φs3, the currents of the joint field-effect transistors do not flow with the accumulated signal charges of the island-shaped semiconductors P21, P22, P23, P31, P32, and P33 being held therein. In this manner, in the first signal charge discharging period Tre1, only accumulated signal charges of the island-shaped semiconductors P11, P12, and P13 connected to the pixel selection line Φp1 are discharged.

Third Embodiment

Figure 3A:
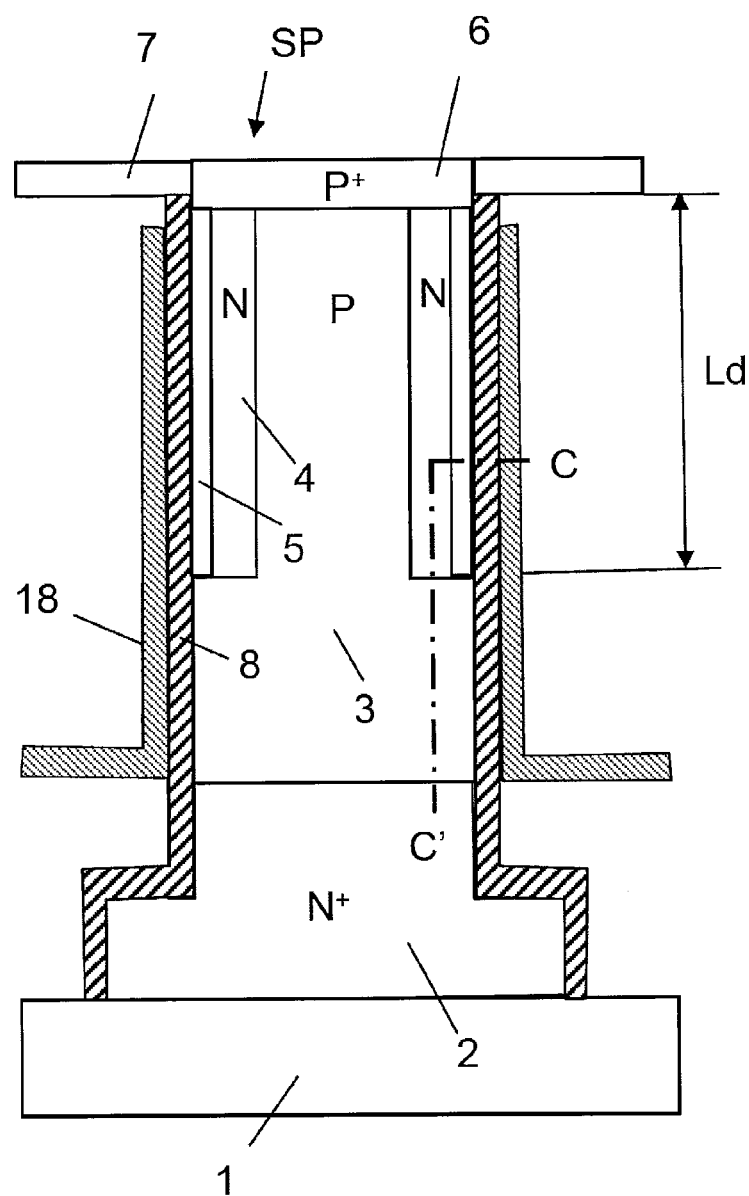
FIG. 3A is a diagram illustrating a cross-sectional structure of a pixel of a solid-state imaging device according to a third embodiment of the present invention.
Figure 3B:
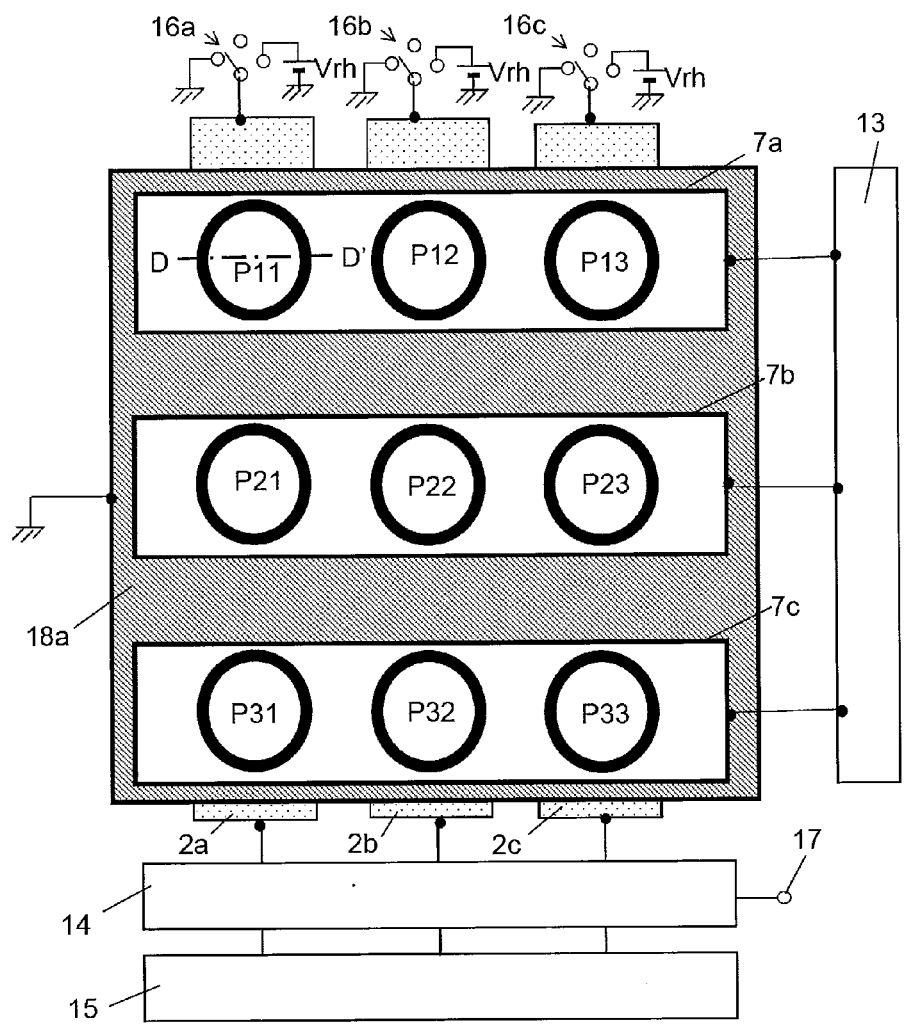
FIG. 3B is a schematic plan view of the solid-state imaging device according to the third embodiment.

Referring to FIGS. 3A and 3B, a solid-state imaging device according to a third embodiment will be described below. Compared with the solid-state imaging device according to the first embodiment, the solid-state imaging device according to this embodiment has a feature that the solid-state imaging device successfully reduces leakage of light, which is incident on island-shaped semiconductors SP, P11 to P33 constituting pixels, to neighboring pixels.

FIG. 3A is a diagram illustrating a cross-sectional structure of a pixel of the solid-state imaging device according to this embodiment. At a bottom portion of the island-shaped semiconductor SP formed above a substrate 1, a signal line N+ region 2 is formed. On this signal line N+ region 2, a P region 3 is formed. At an upper outer periphery portion of this P region 3, an N region 4 is formed. On a side surface of the island-shaped semiconductor SP, a P+ region 5 is formed so as to surround this N region 4. A P+ region 6 is formed on an upper surface of the island-shaped semiconductor SP so as to be connected to this P+ region 5. The P+ region 6 is connected to a pixel selection line conductor layer 7. An insulating layer 8 is formed so as to surround the outer periphery portions of the signal line N+ region 2 and the island-shaped semiconductor SP. At an outer periphery portion of this insulating layer 8, a light-shielding conductor layer 18 is formed so as to surround the P region 3, the N region 4, and the P+ region 5. In the entire pixel region, this light-shielding conductor layer 18 is formed so as to be continuous and to surround the island-shaped semiconductors P11, P12, P13, P21, P22, P23, P31, P32, and P33.

FIG. 3B is a schematic plan view of the solid-state imaging device according to this embodiment. A light-shielding conductor layer 18a (which corresponds to the light-shielding conductor layer 18 illustrated in FIG. 3A) is formed so as to surround the individual island-shaped semiconductors P11 to P33 formed in the entire pixel region and so as to be continuous in the entire pixel region. A potential of this light-shielding conductor layer 18a is set to be a ground potential (=0 V). The schematic plan view of this solid-state imaging device is the same as the one illustrated in FIG. 2A except for this light-shielding conductor layer 18a.

The light-shielding conductor layer 18 is not included in the diagram of the cross-sectional structure of a pixel illustrated in FIG. 1A. In this case, it is necessary to prevent light that is incident from the P$^+$ region 6 side of the island-shaped semiconductor SP from leaking to neighboring island-shaped semiconductors. To prevent such light leakage in the embodiment illustrated in FIG. 1A, it is necessary to form a light-shielding layer, which has a gap on the P$^+$ region 6, at the upper portion of the island-shaped semiconductor SP and to optically design the shape of a microlens formed on the light-shielding layer so that the incident light does not leak to neighboring island-shaped semiconductors. Such a countermeasure through design/formation of the light-shielding layer and microlenses, however, leads to a decrease in the light collection ratio of the island-shaped semiconductors SP. In contrast, in this embodiment including the light-shielding conductor layer 18, it is possible to easily prevent light that is incident on the island-shaped semiconductor SP from leaking to neighboring island-shaped semiconductors. Accordingly, the solid-state imaging device according to the third embodiment reduces light leakage to neighboring island-shaped semiconductors by a larger amount than that of the solid-state imaging device according to the first embodiment illustrated in FIG. 1A.

Also, as illustrated in FIG. 3B, the light-shielding conductor layer 18a just has to be formed so as to be continuous in the entire pixel region in the solid-state imaging device according to this embodiment, which thus omits the necessity of fine patterning in the pixel region that is needed when the gate conductor layers 105, 105a, 105b, and 105c of the solid-state imaging device according to the known example illustrated in FIGS. 9A and 9B are formed.

Fourth Embodiment

Figure 4A:
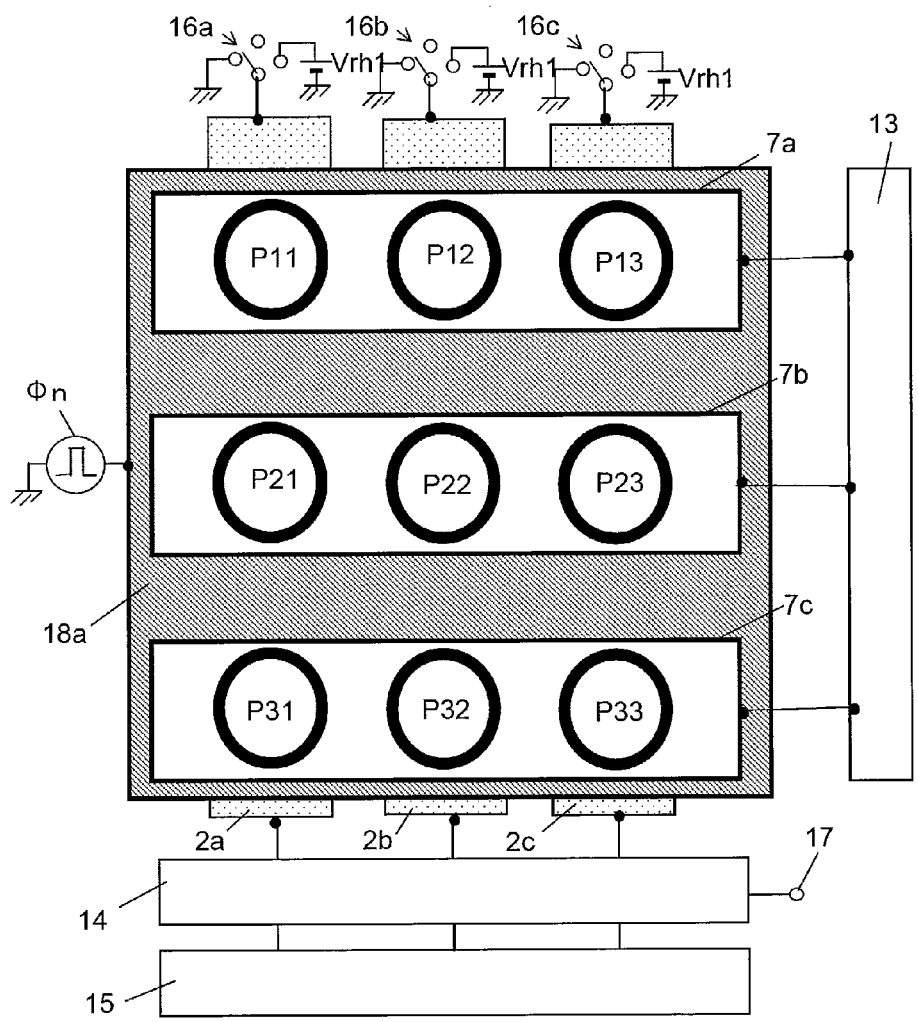
FIG. 4A is a schematic plan view of a solid-state imaging device according to a fourth embodiment of the present invention.
Figure 4B:
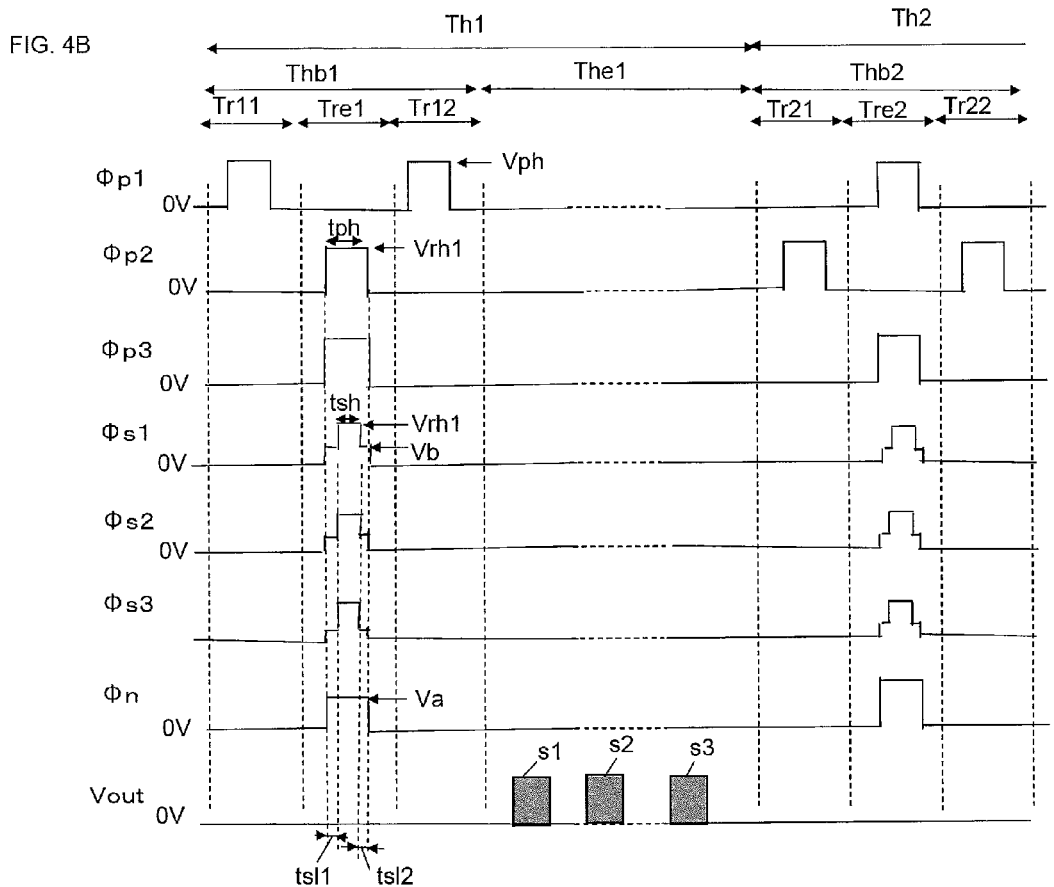
FIG. 4B is a voltage waveform diagram illustrating relationships among a voltage waveform of the pulse voltage source Φn, driving voltage waveforms applied to pixel selection lines Φp1 to Φp3 and to signal lines Φs1 to Φs3, and a voltage waveform at a signal output terminal Vout of the solid-state imaging device according to the fourth embodiment.
Figure 4C:
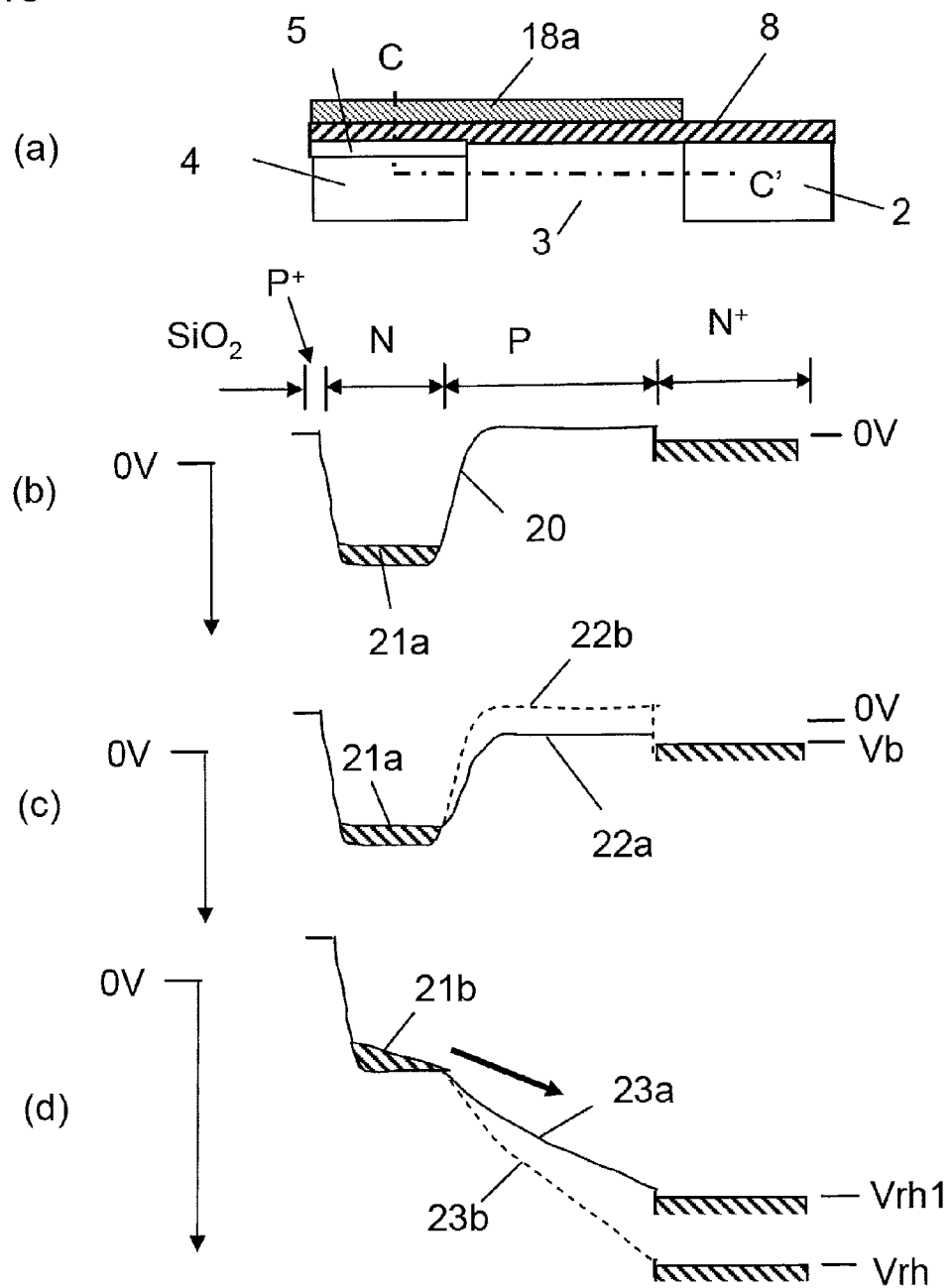
FIG. 4C is a diagram illustrating a change in a potential distribution in a region along a line C-C' in the diagram of the cross-sectional structure of the pixel illustrated in FIG. 3A during a signal charge discharging operation performed in the solid-state imaging device according to the fourth embodiment of the present invention.

Referring to FIG. 4A, FIG. 4B, and FIG. 4C, a solid-state imaging device according to a fourth embodiment will be described below. Compared with the solid-state imaging device according to the third embodiment, the solid-state imaging device according to this embodiment has a feature that the solid-state imaging device successfully achieves a further reduction in driving power consumption of the solid-state imaging device compared with the solid-state imaging device according to the third embodiment.

FIG. 4A is a schematic plan view of the solid-state imaging device according to this embodiment. In the third embodiment illustrated in FIG. 3B, the potential of the light-shielding conductor layer 18a is set to be the ground potential. However, in the solid-state imaging device according to this embodiment, the light-shielding conductor layer 18a is connected to a pulse voltage source Φn so that a pulse voltage is applied to the light-shielding conductor layer 18a.

FIG. 4B illustrates relationships among a voltage waveform of the pulse voltage source Φn, driving voltage waveforms applied to pixel selection lines Φp1, Φp2, and Φp3 and signal lines Φs1, Φs2, and Φs3, and a voltage waveform at a signal output terminal Vout. In a first signal charge discharging period Tre1, during a period tph during which a low-level voltage Vb and a high-level voltage Vrh1 (an application period tsh) higher than this low-level voltage Vb are applied to the signal lines Φs1, Φs2, and Φs3, the high-level voltage Vrh1 is applied to the pixel selection lines Φp2 and Φp3. During the same period tsh as that of the signal line Φs1, the same high-level voltage Vrh1 as that applied to the signal line Φs1 is applied to the signal lines Φs2 and Φs3. In a first ineffective blanking period Thb1, during the period tph during which the high-level voltage Vrh1 is applied to the pixel selection lines Φp2 and Φp3, the voltage of the pulse voltage source Φn is a high-level voltage Va. Also, in a second ineffective blanking period Thb2, an operation similar to this one is repeated.

FIG. 4C (a) to (d) illustrate a change in a potential distribution in a region along a line C-C' in the cross-sectional structure of the pixel illustrated in FIG. 3A during a signal charge discharging operation. FIG. 4C (a) is an enlarged view of the region along the line C-C' in FIG. 3A. On one side of the P region 3, the N region 4 constituting a photodiode and the P$^+$ region 5 connected to the P$^+$ region 6 are formed, whereas on the other side, the signal line N$^+$ region 2 is formed. The insulating layer 8 is formed on the surfaces of the P$^+$ region 5, the P region 3, and the signal line N$^+$ region 2. Further, the light-shielding conductor layer 18a is formed on this insulating layer 8.

FIG. 4C (b) illustrates a potential distribution 20 obtained during the signal charge accumulating operation. During this operation, potentials of the P$^+$ region 5, the signal line N$^+$ region 2, and the light-shielding conductor layer 18a are set to be a ground potential. In this state, many free electrons exist in the signal line N$^+$ region 2. The potential distribution 20 is created which has a potential well in the N region 4 of the photodiode. At this time, signal charges 21a generated by radiation of light are accumulated in the potential well and do not move to the signal line N$^+$ region 2.

FIG. 4C (c) illustrates potential distributions 22a and 22b obtained during the first ineffective blanking period Thb1. The potential distribution 22a obtained during the first signal charge discharging period Tre1 in which the voltage of the pulse voltage source Φn is the high-level voltage Va and the voltages of the signal lines Φs1, Φs2, and Φs3 are the low-level voltage Vb is illustrated by a solid line. The potential distribution 22b obtained when the voltage of the pulse voltage source Φn and the voltages of the pixel selection lines Φp1, Φp2, and Φp3 and the signal lines Φs1, Φs2, and Φs3 are the ground potential is illustrated by a dotted line (which corresponds to the third embodiment). In this embodiment, the high-level voltage Va is applied to the light-shielding conductor layer 18a, whereby the potential between the photodiode N region 4 and the signal line N$^+$ region 2 increases as illustrated by the potential distribution 22a, compared with the potential distribution 22b for the case where the light-shielding conductor layer 18a has the ground potential.

Next, FIG. 4C (d) illustrates, by using a solid line, a potential distribution 23a obtained during the signal charge discharging period tsh during which the high-level voltage Vrh1 is applied to the signal lines Φs1, Φs2, and Φs3. FIG. 4C (d) also illustrates, by using a dotted line, a potential distribution 23b obtained when the voltage of the pulse voltage source Φn is the ground potential and the high-level voltage Vrh is applied to the signal lines Φs1, Φs2, and Φs3 (which corresponds to the third embodiment). As illustrated, the potential distribution changes from the potential distribution 23b illustrated by the dotted line to the potential distribution 23a illustrated by the solid line, and consequently accumulated signal charges 21b are discharged to the signal line N$^+$ region 2. In this case, when the accumulated signal charges 21b move to the signal line N$^+$ region 2, the sufficiently high-level voltage Vrh1 needs to be applied to the signal line N$^+$ region 2 so that a potential barrier is not created in the potential distribution in the P region 3 located between the N region 4 and the signal line N$^+$ region 2. Because of a rise in the potential of the P region 3 resulting from application of the high-level voltage Va to the light-shielding conductor layer 18a illustrated in FIG. 4C (c), this high-level voltage Vrh1 becomes a voltage lower than the high-level voltage Vrh that needs to be applied to the signal line N+ region 2 when the light-shielding conductor layer 18a has the ground potential. The voltage applied to this signal line N+ region 2 is lowered to approximately 1 V. Such lowering of the voltage to approximately 1 V significantly contributes to a reduction in driving power consumption of the solid-state imaging device in the driving voltage of the signal line N+ region 2 of 3 to 5 V. This promotes a reduction in the driving voltage of the solid-state imaging device and also further promotes a reduction in the power consumption of the solid-state imaging device according to this embodiment.

In FIG. 4B, the case has been described in which the high-level voltage Va is applied to the pulse voltage source Φn during the same period tph as the period, during which the high-level voltage Vrh1 is applied to the pixel selection lines Φp2 and Φp3 and which includes the preceding and following periods of the period tsh during which the high-level voltage Vrh1 is applied to the signal lines Φs1, Φs2, and Φs3. The potential distribution 23a illustrated in FIG. 4C (d) is achieved if the high-level voltage Va is applied to the light-shielding conductor layer 18a and the high-level voltage Vrh1 is applied to the signal line N+ region 2. Accordingly, advantages of this embodiment are obtained if the period during which the high-level voltage Vrh1 is applied to the signal lines Φs1, Φs2, and Φs3 and the period during which the high-level voltage Va is applied to the pulse voltage source Φn overlap one another for a given period.

In FIG. 4B, during the preceding and following periods of the period tsh within the first signal charge discharging period Tre1, the low-level voltage Vb is applied to the signal lines Φs1, Φs2, and Φs3. Instead of the low-level voltage Vb, the ground voltage (=0 V) may be applied. In this case, a voltage with which free electrons do not move from the signal line N+ region 2 to the N region 4 is applied to the light-shielding conductor layer 18a.

Also, in FIG. 4B, during a period except for the period tph, the potentials of the signal lines Φs1, Φs2, and Φs3 are set to be the ground potential. However, the low-level voltage Vb may be applied. During the period during which this low-level voltage Vb is applied, the potential distribution, illustrated in FIG. 4C (b), in which signal charges 21a are accumulated in the potential well is obtained. Accordingly, the voltage Vrh1 applied to the signal lines Φs1, Φs2, and Φs3 during the first signal charge discharging period Tre1 lowers.

Fifth Embodiment

Figure 5A:
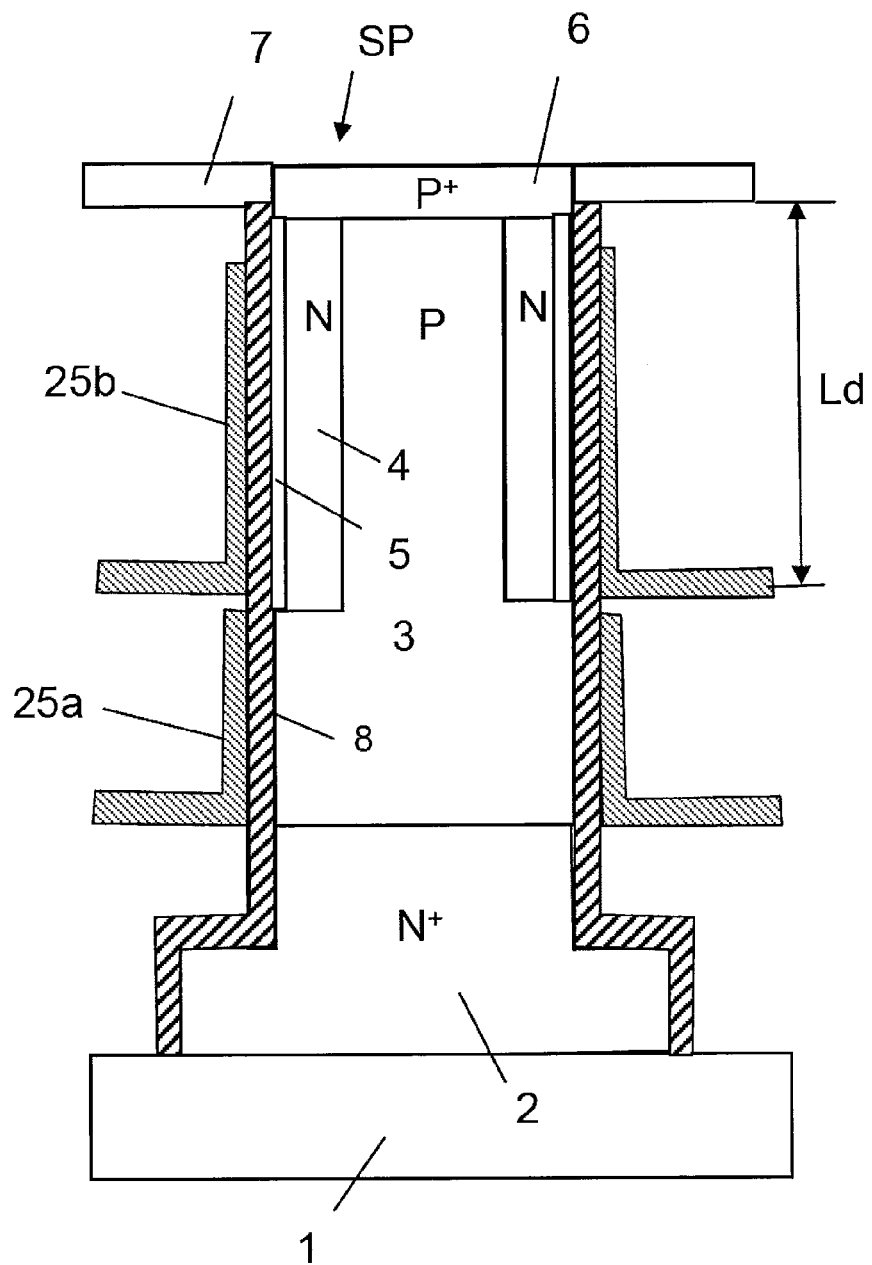
FIG. 5A is a diagram illustrating a cross-sectional structure of a pixel of a solid-state imaging device according to a fifth embodiment of the present invention.
Figure 5B:
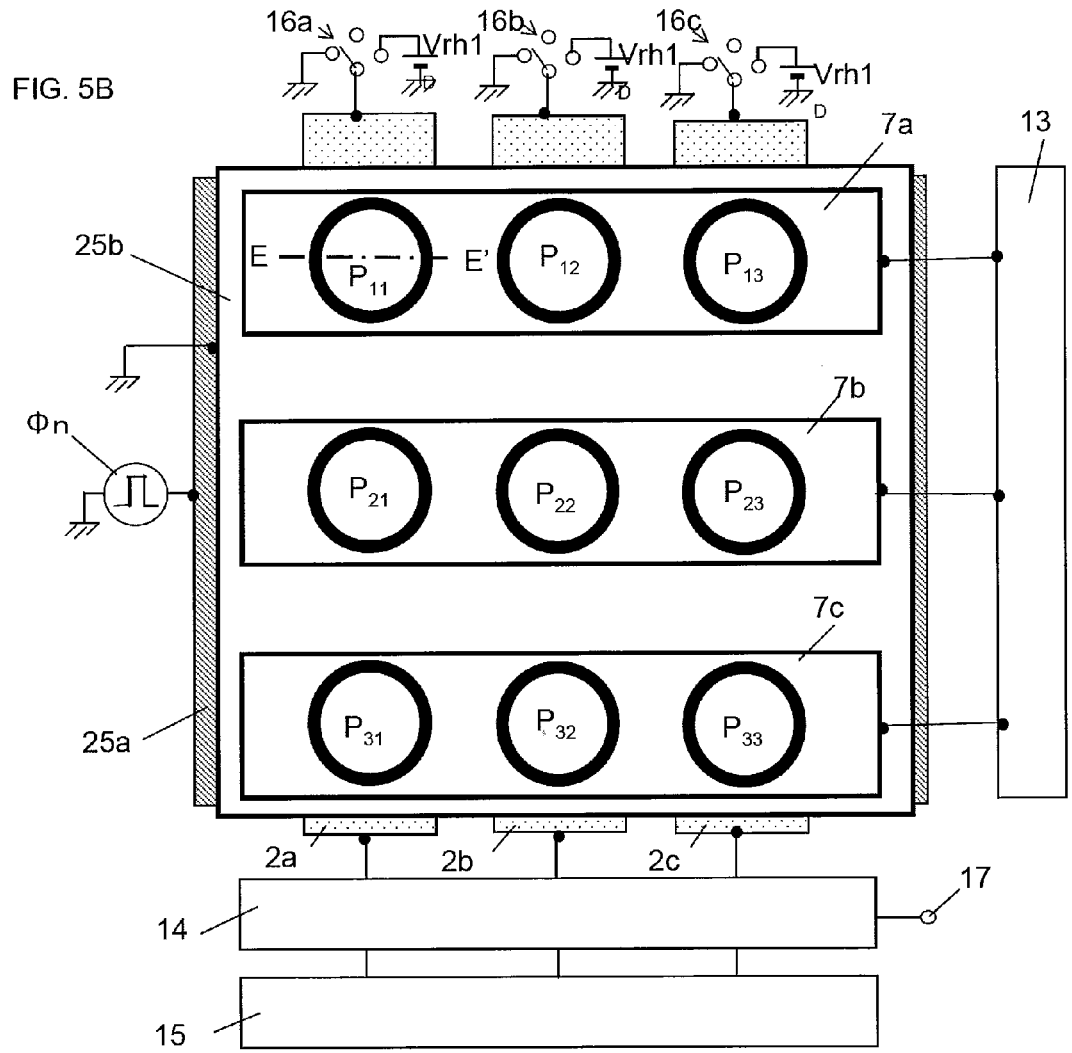
FIG. 5B is a schematic plan view of the solid-state imaging device according to the fifth embodiment.

Referring to FIG. 5A and FIG. 5B, a solid-state imaging device according to a fifth embodiment will be described below. The solid-state imaging device according to this embodiment has a feature that a more reliable signal charge discharging operation and a higher-speed driving are achieved, compared with the solid-state imaging device according to the fourth embodiment.

FIG. 5A is a diagram illustrating a cross-sectional structure of a pixel of the solid-state imaging device according to this embodiment. A signal line N+ region 2 is formed on a substrate 1. On this signal line N+ region 2, an island-shaped semiconductor SP is formed. On the signal line N+ region 2, a P region 3 is formed in the island-shaped semiconductor SP. At an upper outer periphery portion of this P region 3, an N region 4 is formed. On a side surface of the island-shaped semiconductor SP, a P+ region 5 is formed so as to surround this N region 4. At an outer periphery portion of the island-shaped semiconductor SP, an insulating layer 8 is formed so as to surround the P+ region 5, the P region 3, and the signal line N+ region 2. A P+ region 6 is formed on an upper surface of the island-shaped semiconductor SP so as to be connected to this P+ region 5. The P+ region 6 is connected to a pixel selection line conductor layer 7. A first light-shielding conductor layer 25a is formed so as to surround the insulating layer 8 that is formed on the P region 3 located between the N region 4 and the signal line N+ region 2. A second light-shielding conductor layer 25b is formed so as to surround the insulating layer 8 that is formed at the outer periphery portions of the N region 4 and the P+ region 5. The second light-shielding conductor layer 25b is separated from the pixel selection line conductor layer 7. Each of the first light-shielding conductor layer 25a and the second light-shielding conductor layer 25b is formed so as to be continuous in the entire pixel region.

FIG. 5B is a schematic plan view of the solid-state imaging device according to this embodiment. A cross-sectional structure taken along a line E-E' in FIG. 5B corresponds to FIG. 5A. The first light-shielding conductor layer 25a is formed so as to surround individual island-shaped semiconductors P11 to P33 in the pixel region and so as to be continuous all over the pixel region. As in the fourth embodiment, a pulse voltage source Φn is connected to this first light-shielding conductor layer 25a. The second light-shielding conductor layer 25b is formed so as to surround the individual island-shaped semiconductors P11 to P33 in the pixel region and so as to be continuous all over the pixel region. A ground potential is applied to this second light-shielding conductor layer 25b. A voltage having the same waveform as the voltage applied to the pulse voltage source Φn illustrated in FIG. 4B is applied to the first light-shielding conductor layer 25a. As described above, in the solid-state imaging device according to this embodiment, each of the first light-shielding conductor layer 25a and the second light-shielding conductor layer 25b just has to be formed so as to be continuous all over the pixel region, which, as in the third and fourth embodiments, thus omits the necessity of fine patterning in the pixel region that is needed in formation of the gate conductor layers 105, 105a, 105b, and 105c in the known solid-state imaging device illustrated in FIG. 9A and FIG. 9B.

In the solid-state imaging device according to this embodiment, the first light-shielding conductor layer 25a is separated from the second light-shielding conductor layer 25b. Load capacitance of the pulse voltage source Φn during the signal charge discharging operation is capacitance connected to the first light-shielding conductor layer 25a. This load capacitance is mainly capacitance of the insulating layer 8 located between the first light-shielding conductor layer 25a and the P region 3. A height of the island-shaped semiconductors SP and P11 to P33 that constitute pixels are mainly decided by a height Ld of the N region 4 of the photodiode because of the required spectral sensitivity characteristics. The second light-shielding conductor layer 25b is formed so as to surround this N region 4. Accordingly, the load capacitance of the pulse voltage source Φn during the signal charge discharging operation reduces by a large amount, compared with the solid-state imaging device according to the fourth embodiment illustrated in FIG. 4A. This leads to a reduction in the rising and falling times between the ground potential and the high-level voltage Va of the pulse voltage source Φn during the signal charge discharging operation. As a result of this, a more reliable signal charge discharging operation is achieved. A high-speed imaging operation of the solid-state imaging device requires a reduction in each operation time. Thus, this embodiment contributes to an increase in speed of the solid-state imaging device.

Sixth Embodiment

Figure 6A:
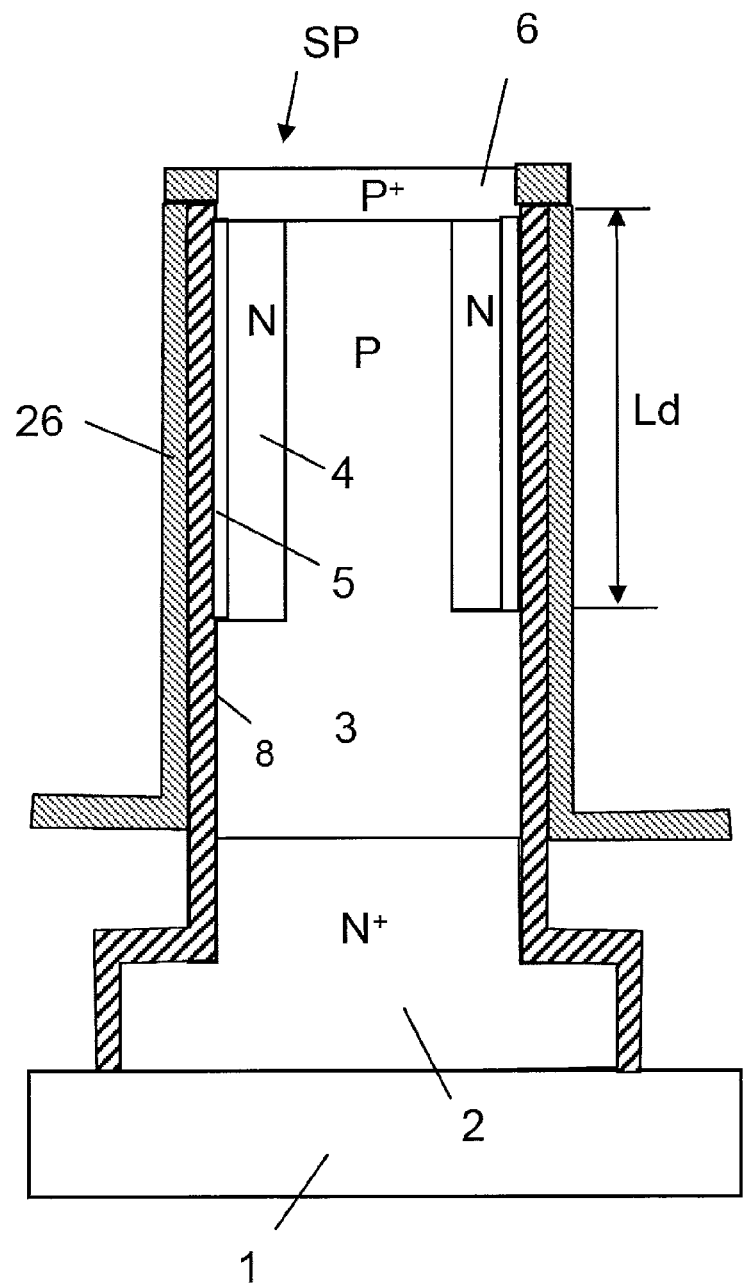
FIG. 6A is a diagram illustrating a cross-sectional structure of a pixel of a solid-state imaging device according to a sixth embodiment of the present invention.
Figure 6B:
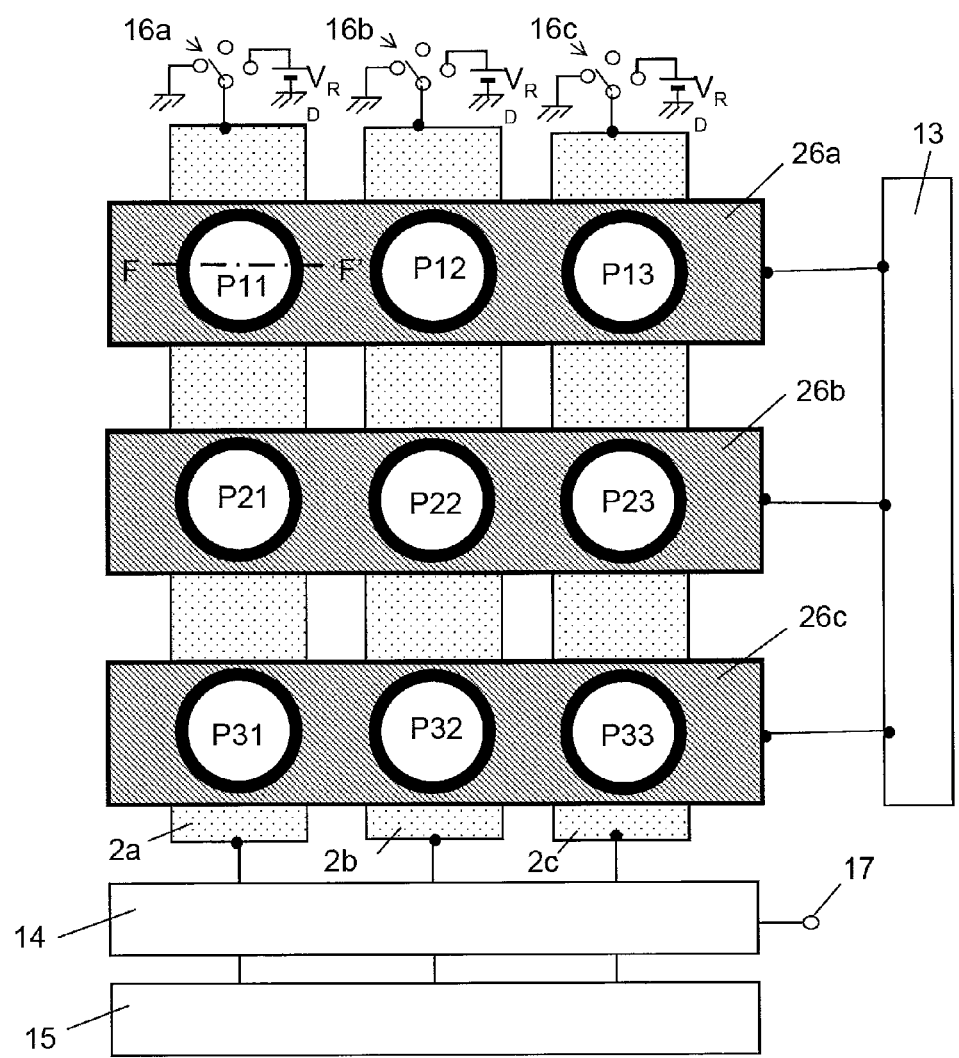
FIG. 6B is a schematic plan view of the solid-state imaging device according to the sixth embodiment.

Referring to FIG. 6A and FIG. 6B, a solid-state imaging device according a sixth embodiment will be described below. This embodiment has a feature that leakage of light, which is incident on island-shaped semiconductors P11 to P33 constituting pixels, to neighboring pixels can be reduced by allowing the pixel selection line conductor layer 7 described in the first embodiment illustrated in FIG. 1A to also function as a light-shielding conductor layer.

FIG. 6A is a diagram of a cross-sectional structure of a pixel of the solid-state imaging device according to this embodiment. At a bottom portion of the island-shaped semiconductor SP formed above a substrate 1, a signal line $N^+$ region 2 is formed. On this signal line $N^+$ region 2, a P region 3 is formed. At an upper outer periphery portion of this P region 3, an N region 4 is formed. On a side surface of the island-shaped semiconductor SP, a $P^+$ region 5 is formed so as to surround this N region 4. A $P^+$ region 6 is formed on an upper surface of the island-shaped semiconductor SP so as to be connected to this $P^+$ region 5. An insulating layer 8 is formed so as to surround the outer periphery portions of the signal line $N^+$ region 2 and the island-shaped semiconductor SP. At an outer periphery portion of this insulating layer 8, a light-shielding pixel selection line conductor layer 26 is formed so as to surround the P region 3, the N region 4, and the $P^+$ region 5 and so as to be connected to the $P^+$ region 6. Accordingly, in this embodiment, the pixel selection line conductor layer 26 has both a function as the pixel selection line and a function of preventing light leakage to neighboring island-shaped conductors.

FIG. 6B is a schematic plan view of the solid-state imaging device according to this embodiment. A cross-sectional structure of a pixel taken along a line F-F' in FIG. 6B corresponds to FIG. 6A. The pixel selection line conductor layers 7a, 7b, and 7c illustrated in the schematic plan view of the solid-state imaging device according to the second embodiment illustrated in FIG. 2A are replaced with light-shielding pixel selection line conductor layers 26a, 26b, and 26c in the schematic plan view of FIG. 6B. Other than this, the configuration illustrated in FIG. 6B is the same as that of FIG. 2A. In this manner, this embodiment omits the necessity of separately forming the pixel selection line conductor layers 7, 7a, 7b, and 7c and the light-shielding conductor layers 18 and 18a illustrated in FIG. 3A and FIG. 3B, and the light-shielding pixel selection line conductor layers 26a, 26b, and 26c have both functions. This makes fabrication of the solid-state imaging device easier.

This embodiment is also applicable to a case where the second light-shielding conductor layer 25b and the pixel selection line conductor layer 7 are integrated in the fifth embodiment illustrated in FIG. 5A. In FIG. 6A, the bottom portion of the light-shielding pixel selection line conductor layer 26 is formed so as to be located at an upper end of the signal line $N^+$ region 2 in the island-shaped semiconductor SP constituting a pixel. However, the bottom portion may be located above or below the upper end of this signal line $N^+$ region 2.

Seventh Embodiment

Figure 7A:
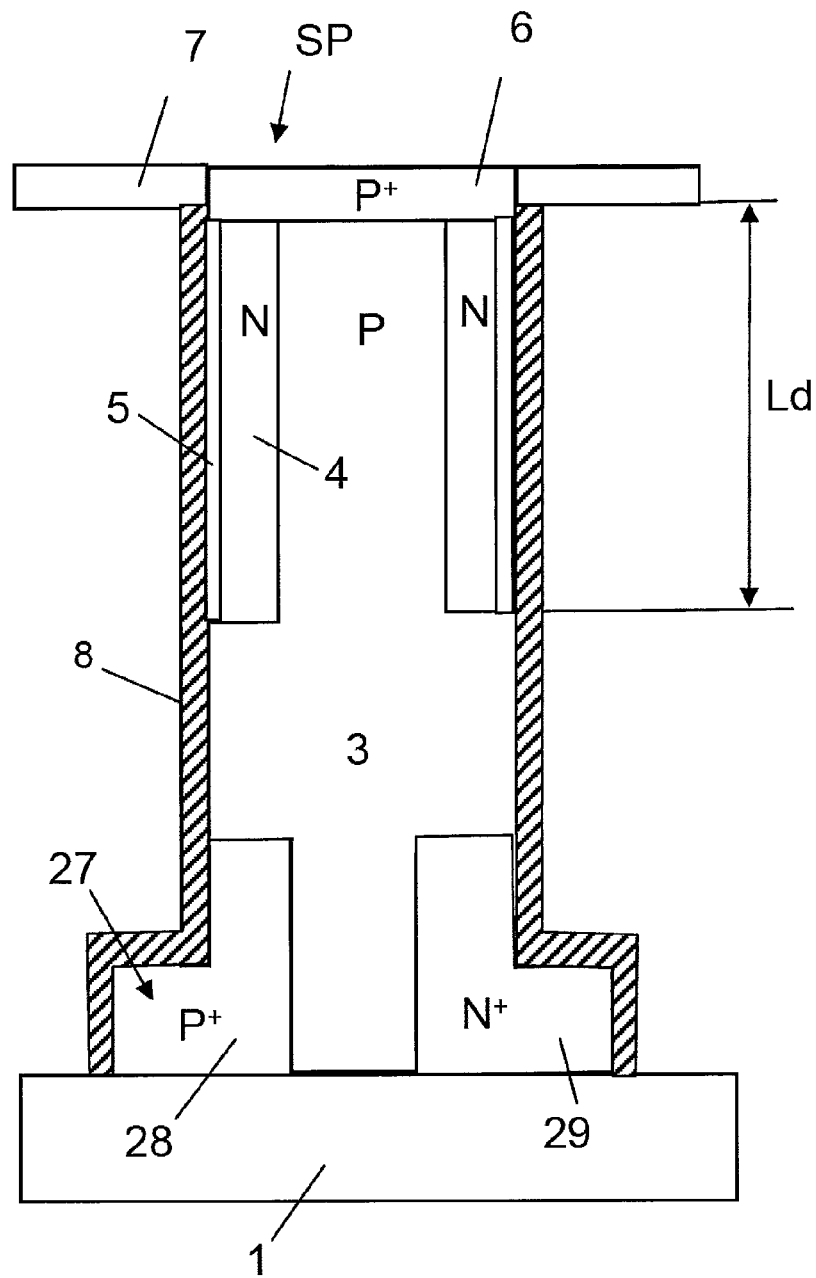
FIG. 7A is a diagram illustrating a cross-sectional structure of a pixel of a solid-state imaging device according to a seventh embodiment of the present invention.
Figure 7B:
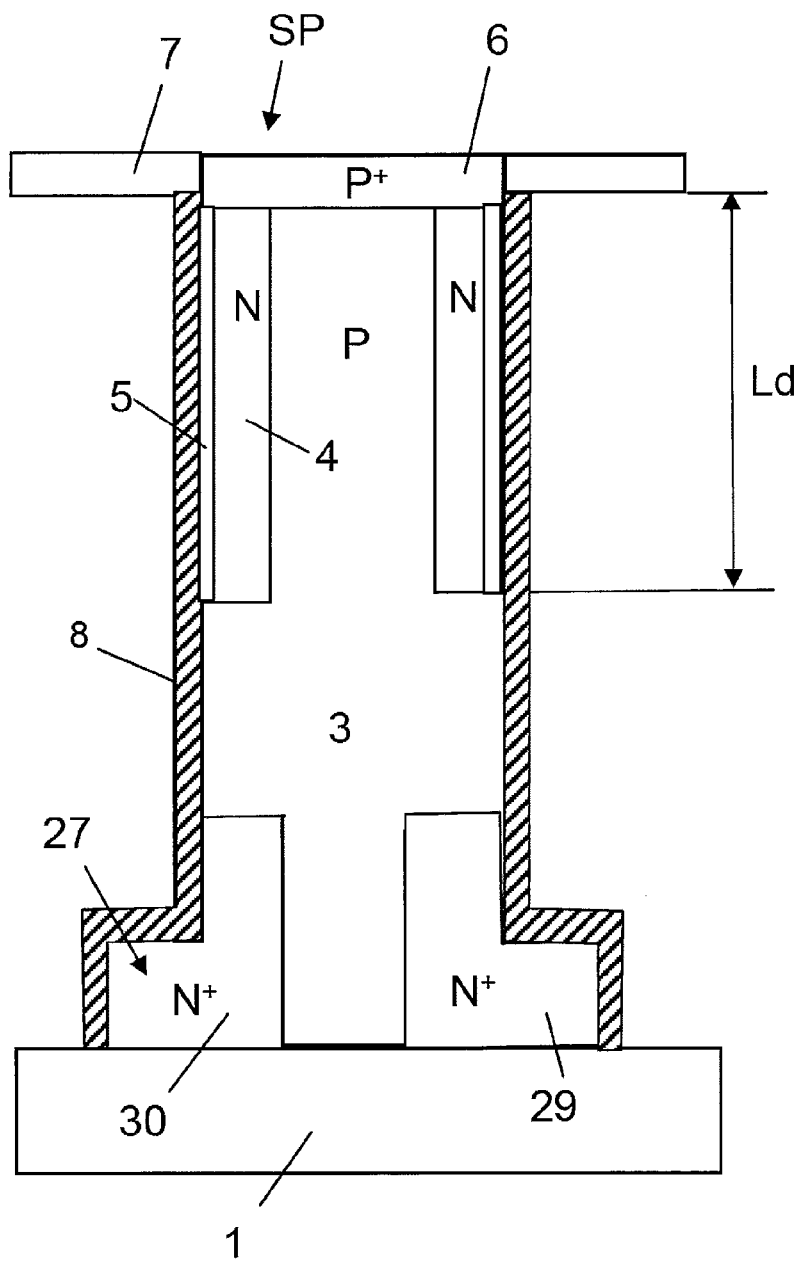
FIG. 7B is a diagram illustrating a cross-sectional structure of a pixel of the solid-state imaging device according to the seventh embodiment.

Referring to FIG. 7A and FIG. 7B, solid-state imaging devices according to a seventh embodiment will be described below.

FIG. 7A illustrates a cross-sectional structure of a first solid-state imaging device according to the seventh embodiment. A band-shaped semiconductor 27, which includes a signal line $P^+$ region 28, a P region 3, and a signal charge discharging $N^+$ region 29, is formed on a substrate 1. On this band-shaped semiconductor 27, an island-shaped semiconductor SP is formed. The P region 3 is formed so as to be connected to the island-shaped semiconductor SP formed on the band-shaped semiconductor 27. At an upper periphery portion of this P region 3, an N region 4 is formed. On a side surface of the island-shaped semiconductor SP, a $P^+$ region 5 is formed so as to surround this N region 4. A $P^+$ region 6 is formed on an upper surface of the island-shaped semiconductor SP so as to be connected to this P region 5. The $P^+$ region 6 is connected to a pixel selection line conductor layer 7. An insulating layer 8 is formed so as to surround outer periphery portions of the band-shaped semiconductor 27 and the island-shaped semiconductor SP.

In the solid-state imaging device according to this embodiment, the P region 3 and the N region 4 constitute a photodiode region. When light is incident from the $P^+$ region 6 side of the island-shaped semiconductor SP, signal charges (free electrons in this case) are generated in a photoelectric conversion region of the photodiode region. These signal charges are accumulated mainly in the N region 4 of the photodiode region. In this island-shaped semiconductor SP, a junction field-effect transistor is formed in which this N region 4 serves as a gate, the $P^+$ region 6 serves as a source, and the signal line $P^+$ region 28 serves as a drain. A drain-source current (an output signal) of the junction field-effect transistor changes in accordance with the amount of signal charges accumulated in the N region 4 and are read out as a signal output via the signal line $P^+$ region 28. Further, the signal charges accumulated in this N region 4 are discharged to the signal charge discharging $N^+$ region 29 by setting the $P^+$ region 6 to have a ground potential (=0 V) and applying a positive ON voltage to the signal charge discharging $N^+$ region 29.

In FIG. 1A, the signal line $N^+$ region 2 has both the function of extracting the drain-source current (the output signal) of the junction field-effect transistor and the function of discharging signal charges. In contrast, in this embodiment, the signal line $P^+$ region 28, the P region 3, and the signal charge discharging $N^+$ region 29 are formed instead of the signal line $N^+$ region 2. The drain-source current (the output signal) of the junction field-effect transistor is extracted by using the signal line $P^+$ region 28, whereas signal charges are discharged by using the signal charge discharging $N^+$ region 29. With this configuration, the drain-source voltage of the junction field-effect transistor can be reduced to be close to 0 V by using the $P^+$ region 28 as the signal line in this embodiment, while in the solid-state imaging device illustrated in FIG. 1A, the drain-source voltage of the junction field-effect transistor that cause the drain-source current of the junction field-effect transistor to start to flow is equal to or higher than a voltage (approximately 0.7 V in the case of silicon semiconductors) that is needed for forward-biasing a diode constituted by the signal line $N^+$ region 2 and the P region 3. This reduction in driving voltage reduces driving power consumption of the solid-state imaging device. Also, because discharging of signal charges can be performed by using the signal charge discharging $N^+$ region 29, which is independent of the signal line $P^+$ region 28, excessive signal charges generated by light with too strong brightness that is incident on the island-shaped semiconductor SP can be discharged using this signal charge discharging $N^+$ region 29 by applying a low-level voltage that is lower than a high-level voltage Vph that is applied to this signal charge discharging $N^+$ region 29 during the signal charge discharging period tsh.

FIG. 7B illustrates a cross-sectional structure of a second solid-state imaging device according to this embodiment. In this second solid-state imaging device, the signal line $P^+$ region 28 illustrated in FIG. 7A is replaced with a signal line $N^+$ region 30. Other than this, the configuration is the same as that of FIG. 7A. In this embodiment, the signal line $N^+$ region 30, the P region 3, and the signal charge discharging $N^+$ region 29 are formed instead of the signal line $N^+$ region 2. An operation of extracting the drain-source current (the output signal) of the junction field-effect transistor is performed using the signal line $N^+$ region 30, whereas a signal charge discharging operation is performed using the signal charge discharging $N^+$ region 29. In the solid-state imaging device illustrated in FIG. 1A, the signal line $N^+$ region 2 has both the function of extracting the drain-source current (the output signal) of the junction field-effect transistor and the function of discharging signal charges. However, in this embodiment as in FIG. 7A, the function of extracting the output signal and the function of discharging signal charges are separated. Unlike the solid-state imaging device illustrated in FIG. 7A, the solid-state imaging device according to this embodiment does not have an advantage that the solid-state imaging device can be driven with a low power consumption. However, compared with the solid-state imaging device illustrated in FIG. 1A, the solid-state imaging device according to this embodiment can advantageously maintain the voltage of the signal charge discharging $N^+$ region 29 to a certain voltage and discharge excessive signal charges generated by excessive light radiation via this signal charge discharging $N^+$ region 29 during a period during which signal charges are read out via the signal line $N^+$ region 30.

Eighth Embodiment

Figure 8:
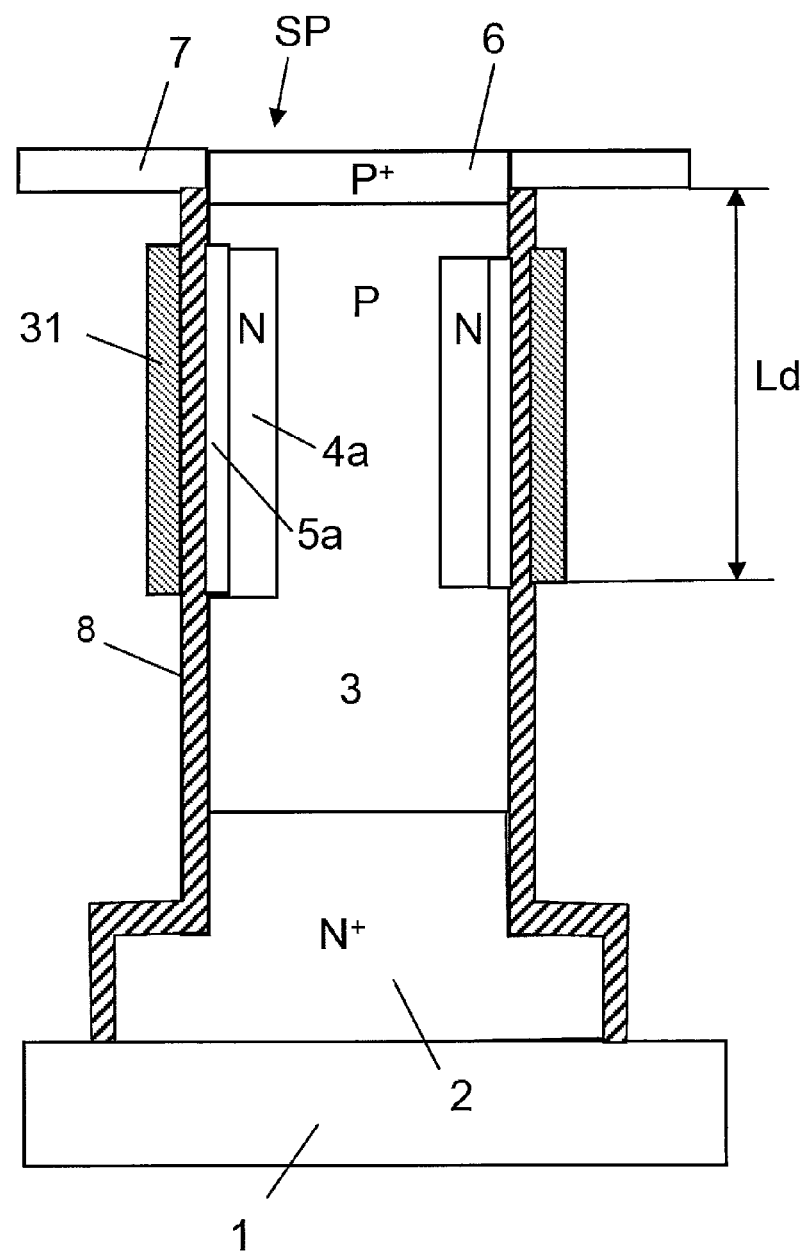
FIG. 8 is a diagram illustrating a cross-sectional structure of a pixel of a solid-state imaging device according to an eighth embodiment of the present invention.

Referring to FIG. 8, a solid-state imaging device according to the eighth embodiment will be described below.

FIG. 8 illustrates a cross-sectional structure of the solid-state imaging device according to this embodiment. As illustrated in FIG. 8, a signal line $N^+$ region 2 is formed. On this signal line $N^+$ region 2, an island-shaped semiconductor SP that constitutes a pixel is formed. On the signal line $N^+$ region 2, a P region 3 is formed in the island-shaped semiconductor SP. At an upper outer periphery portion of this P region 3, an N region $4a$ is formed. On a side surface of the island-shaped semiconductor SP, a $P^+$ region $5a$ is formed so as to surround this N region $4a$. An insulating layer 8 is formed so as to surround outer periphery portions of the signal line $N^+$ region 2 and the island-shaped semiconductor SP. A conductor layer 31 is formed on outer periphery portions of the N region $4a$ and the $P^+$ region $5a$ with the insulating layer 8 interposing therebetween. A $P^+$ region 6 is formed on an upper surface of the island-shaped semiconductor SP so as to be separated from the N region $4a$ and the $P^+$ region $5a$. The $P^+$ region 6 is connected to a pixel selection line conductor layer 7. The conductor layer 31 is formed so as to be separated from the pixel selection line conductor layer 7.

Referring to FIG. 8, in the solid-state imaging device according to this embodiment, a voltage with which positive holes are accumulated is applied to the conductor layer 31 after the voltage of the $P^+$ region $5a$ formed at the outer periphery portion of the island-shaped semiconductor SP becomes a low-level voltage. A ground voltage and a high-level voltage are then applied to the $P^+$ region 6 and the signal line $N^+$ region 2, respectively, to discharge signal charges accumulated in the N region $4a$ to the signal line $N^+$ region 2. Signal charges accumulated in the N region $4a$ are discharged to the signal line $N^+$ region 2 by applying a voltage to the conductor layer 31 as in the solid-state imaging device illustrated in FIG. 1A. This conductor layer 31 has a function of a light-shielding conductor layer that prevents light, which is incident on the island-shaped semiconductor SP, from leaking to neighboring island-shaped semiconductors.

In the first embodiment, the signal line $N^+$ region 2 is formed as illustrated in FIG. 1A. Advantages similar to those of this embodiment are obtained even with a solid-state imaging device in which conductivity types of semiconductors of all semiconductor regions are inversed, such as by changing the signal line $N^+$ region 2 to a $P^+$ region, the P region 3 to an N region, the N region 4 to a P region, and the P regions 5 and 6 to $N^+$ regions. This is applicable to each of the above-described embodiments in common.

In the first embodiment, the signal line $N^+$ region 2 is formed on the substrate 1 as illustrated in FIG. 1A. However, the configuration is not limited to this one. This substrate 1 may be a material layer, which is an insulating layer or a semiconductor layer and which allows the operation of the solid-state imaging device according to each of the embodiments to be performed. This is applicable to each of the above-described embodiments in common.

In the description of the first embodiment using FIG. 1A, the case has been described in which the pixel selection line conductor layer 7 is connected to the $P^+$ region 6 from side surfaces of the island-shaped semiconductor SP. However, this pixel selection conductor layer may be connected to the $P^+$ region 6 from the upper surface of the island-shaped semiconductor SP by using a transparent conductor material, for example, indium tin oxide (InSnO). This is applicable to each of the above-described embodiments in common.

Obviously, the driving method illustrated in FIG. 2C that describes the second embodiment is applicable in common to the embodiments of the present invention that follow the second embodiment. In the case where the signal line semiconductor regions 28 and 30 and the signal charge discharging $N^+$ region 29 are separately formed as in the seventh embodiment illustrated in FIG. 7A and FIG. 7B, voltage waveforms applied to the signal lines $\Phi s1$, $\Phi s2$, and $\Phi s3$ in FIG. 2C are applied to the signal charge discharging $N^+$ region 29.

As illustrated in FIG. 1B, in the first embodiment, the ground voltage (=0 V) is applied to the signal line $N^+$ region 2 during a period during which the signal charge accumulating operation is performed. However, instead of the ground voltage, a low-level voltage may be applied. Even in this state, the signal charges $10a$ accumulated in the N region 4 are not discharged to the signal line $N^+$ region 2. Also, during a period during which the ground voltage is applied to the signal lines $\Phi s1$, $\Phi s2$, and $\Phi s3$ in the first signal charge discharging period Tre1 illustrated in FIG. 2C, a low-level voltage may be applied. This is applicable to each of the above-described embodiments in common.

Also, a structure may be adopted which lowers resistance of the signal line $N^+$ region 2 by providing a metal layer or a silicide layer between the substrate 1 and the signal line $N^+$ layer region 2. This is similarly applicable to each of the above-described embodiments.

In the first embodiment illustrated in FIG. 1A, the P region 3 may be constituted by an intrinsic semiconductor layer. This intrinsic semiconductor is a semiconductor composed substantially of elements of one kind. The intrinsic semiconductor is fabricated so that no impurity mixes thereto but it actually inevitably contains an extremely small amount of impurity. The P region 2 constituted by this intrinsic semiconductor may contain a very small amount of acceptor or donor impurity as long as the function of the solid-state imaging device is not disturbed. This is applicable to each of the above-described embodiments in common.

FIG. 1A based on the first embodiment illustrates the solid-state imaging device in which the N+ region 2 is connected to a signal line and the P+ region 6 is connected to a pixel selection line. However, the N+ region 2 may be connected to the pixel selection line and the P+ region 6 may be connected to the signal line. This is applicable to each of the above-described embodiments in common.

In FIG. 1A based on the first embodiment, the N region 4 is in contact with the P+ region 6. However, the configuration is not limited to this one. The similar advantages are obtained even when the N region 4 is separated from the P+ region 6.

In each of the above-described embodiments, a solid-state imaging device including one pixel or 3×3 pixels is used. Obviously, the technical spirit of the present invention is applicable to solid-state imaging devices in which pixels are one-dimensionally or two-dimensionally arranged.

In solid-state imaging devices to which the technical spirit of the present invention is applied, pixels are preferably, but not limited to, arranged in for example a line form or a zigzag form in the case of the one-dimensional pixel arrangement, and in a linear grid form or a honeycomb form in the case of the two-dimensional pixel arrangement.

Also, the island-shaped semiconductors SP and P11 to P33 according to each of the above-described embodiments may have the shape of a cylinder, the shape of a hexagon, or the other shapes.

The operation illustrated by the voltage waveforms in FIG. 2C is performed by the solid-state imaging device having the cross-sectional structure illustrated in FIG. 1A. The operation is applicable to each of the above-described embodiments as long as the solid-state imaging device is a solid-state imaging device in which the relationships among potentials of the signal line N+ region 2, the P+ region 5, and the P+ region 6 as illustrated in FIGS. 2A to 2C are obtained during the signal charge discharging period.

In FIG. 3B, the ground voltage (=0 V) is applied to the light-shielding conductor layer 18a. However, the configuration is not limited to this one. Even when a low-level voltage that is close to the ground voltage is applied, advantages similar to those of each of the above-described embodiments are obtained.

Also, in each of the above-described embodiments, the solid-state imaging device is used in which signal charges are generated in each pixel by radiation of light. However, the technical spirit of the present invention is obviously applicable to other semiconductor devices in which signal charges are generated in each pixel by radiation of an electromagnetic energy wave, such as visible light, ultraviolet rays, infrared rays, X rays, other electromagnetic rays, radioactive rays, and electron rays.

While the present invention has been described in detail above by using the plurality of embodiments, the scope of the present invention is not limited to each of the above-described embodiments. Improvements, replacements, combinations, and so forth made by persons skilled in the art are covered by the scope of the present invention as long as the improvements, replacements, combinations, and so forth go beyond the technical spirit of the present invention.

What is claimed is:

1. A solid-state imaging device including a pixel region having a plurality of pixels in a two-dimensional array, each of the plurality of pixels comprising:
    a first semiconductor region on a substrate;
    a second semiconductor region on the first semiconductor region;
    a third semiconductor region on an upper side surface of the second semiconductor region;
    a fourth semiconductor region on a side surface of the third semiconductor region, in which the side surface is not facing the side surface of the second semiconductor region, the fourth semiconductor region having a conductivity opposite to a conductivity of the third semiconductor region; and
    a fifth semiconductor region above the second semiconductor region, the fifth semiconductor region having a conductivity opposite to the conductivity of the third semiconductor region,
    wherein the second semiconductor region comprises a semiconductor having a conductivity opposite to the conductivity of the third semiconductor region or an intrinsic semiconductor,
    wherein at least an upper portion of the second semiconductor region, the third semiconductor region, the fourth semiconductor region, and the fifth semiconductor region define an island-shaped semiconductor,
    wherein the second semiconductor region and the third semiconductor region comprise a photodiode,
    wherein signal charges generated by an electromagnetic energy wave that is incident on a region of the photodiode accumulate in the third semiconductor region,
    wherein one of the first semiconductor region and the fifth semiconductor region, the other one of the first semiconductor region and the fifth semiconductor region, and the third semiconductor region, respectively define a drain, a source, and a gate of a junction field effect transistor,
    wherein current that flows between the source and the drain of the junction field-effect transistor in accordance with an amount of signal charges accumulated in the third semiconductor region comprises a signal output,
    wherein a low voltage impinging on the fourth semiconductor region and the fifth semiconductor region and a high voltage impinging on the first semiconductor region higher than the low voltage removes a potential barrier in the second semiconductor region located between the first semiconductor region and the third semiconductor region, and signal charges accumulated in the third semiconductor region are discharged from the third semiconductor region to the first semiconductor region via the second semiconductor region,
    wherein signal currents of the plurality of pixels in at least one row simultaneously flow to a row pixel signal loading circuit outside the pixel region via signal lines in columns of the plurality of pixels connected to the first semiconductor region, and signal outputs from the plurality of pixels in the at least one row impinge on an output circuit included in the row pixel signal loading circuit
    wherein during signal discharging, the low-level voltage impinges on a pixel selection line connected to the fifth semiconductor regions of the plurality of pixels arranged in the at least one row and the high-level voltage impinges on pixel selection lines connected to the plurality of pixels arranged in the other rows, and
    wherein the high-level voltage impinges on the signal lines connected to the columns of the plurality of pixels.

2. The solid-state imaging device according to claim 1, wherein the fourth semiconductor region is connected to the fifth semiconductor region.

3. The solid-state imaging device according to claim 1, wherein the third semiconductor region and the fourth semiconductor region are separated from the fifth semiconductor region, a first conductor layer resides at an outer periphery portion of the fourth semiconductor region with an insulating layer interposing therebetween, and, the low voltage impinges on the fourth semiconductor region, the high-level voltage impinges on the first semiconductor region, and a charge accumulation voltage impinges on the first conductor layer, such that signal charges accumulated in the third semiconductor region are discharged to the first semiconductor region.

4. The solid-state imaging device according to claim 1, wherein the first semiconductor region further includes a sixth semiconductor region that comprises the source or the drain of the junction field-effect transistor, and a seventh semiconductor region includes signal charges accumulated in the third semiconductor region, and wherein the second semiconductor region extends between the sixth semiconductor region and the seventh semiconductor region.

5. The solid-state imaging device according to claim 1, further comprising an insulating layer surrounding the second semiconductor region, the third semiconductor region, and the fourth semiconductor region, and a light-shielding conductor layer surrounding the insulating layer.

6. The solid-state imaging device according to claim 5, wherein the light-shielding conductor layer resides on side surfaces of the island-shaped semiconductors of the plurality of pixels in the pixel region so as to be continuous all over the pixel region.

7. The solid-state imaging device according to claim 5, wherein the light-shielding conductor layer resides on the plurality of pixels in the pixel region so as to be continuous all over the pixel region.

8. The solid-state imaging device according to claim 5, wherein the light-shielding conductor layer is connected to the plurality of pixels in the pixel region and resides all over the pixel region; a high-level voltage impinges on the light-shielding conductor layer during discharging such that a period during which the high-level voltage impinges on the light-shielding conductor layer partially or entirely overlaps a period during which the high-level voltage impinges on the signal lines; and the ground voltage or the low-level voltage impinges on the signal lines during a period other than the period during discharging.

9. The solid-state imaging device according to claim 5, wherein the light-shielding conductor layer surrounds the insulating layer on outer peripheries of the second semiconductor region, the third semiconductor region, and the fourth semiconductor region, and is divided at two or more separate sites.

10. The solid-state imaging device according to claim 5, wherein the light-shielding conductor layer is connected to the fifth semiconductor region.

\* \* \* \* \*